United States Patent
Katagiri

(10) Patent No.: US 7,284,223 B2
(45) Date of Patent: Oct. 16, 2007

(54) WIRING METHOD, PROGRAM, AND APPARATUS

(75) Inventor: Hideaki Katagiri, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 190 days.

(21) Appl. No.: 11/066,461

(22) Filed: Feb. 28, 2005

(65) Prior Publication Data

US 2006/0117290 A1    Jun. 1, 2006

(30) Foreign Application Priority Data

Nov. 29, 2004   (JP)  ............................. 2004-343337

(51) Int. Cl.
*G06F 17/50* (2006.01)
(52) U.S. Cl. .......................................... 716/12; 716/14
(58) Field of Classification Search ................ 716/1, 716/2, 12, 14
See application file for complete search history.

(56) References Cited

U.S. PATENT DOCUMENTS

| | | | | |
|---|---|---|---|---|
| 5,483,481 | A | * | 1/1996 | Hizume et al. ............... 365/63 |
| 6,080,206 | A | | 6/2000 | Tadokoro et al. |
| 6,226,560 | B1 | * | 5/2001 | Hama et al. .................. 700/97 |

FOREIGN PATENT DOCUMENTS

| | | |
|---|---|---|
| JP | 5-160375 | 6/1993 |
| JP | 5-181936 | 7/1993 |
| JP | 5-243383 | 9/1993 |
| JP | 6-124321 | 5/1994 |
| JP | 9-147009 | 6/1997 |
| JP | 10-189746 | 7/1998 |
| JP | 2003-303217 | 10/2003 |

* cited by examiner

*Primary Examiner*—Thuan Do
(74) *Attorney, Agent, or Firm*—Staas & Halsey LLP

(57) ABSTRACT

When one net is wired, by restricting a wiring area, the net is efficiently wired in a short time. A wiring area setting unit sets a maximum rectangle including a set of terminals constructing the net into a wiring area. A wiring deciding unit decides the wiring between the nets so as to realize the shortest distance for the wiring area as a target. If a wiring violation or a non-connected terminal exists, a wiring area enlarging unit enlarges the present wiring area in accordance with a preset parameter and, thereafter, allows the wiring deciding unit to decide the wiring. With respect to a clip net in which in the case where one of a plurality of input terminals having the same function of cells is used, the non-used input terminals are wired as clip terminals to power terminals as well, a cell area is set into a wiring area and wired and if the wiring violation or non-connected clip terminal exists, the present wiring area is enlarged and the wiring is repeated.

25 Claims, 20 Drawing Sheets

| NET NAME | HORIZONTAL ENLARGEMENT | VERTICAL ENLARGEMENT |
|---|---|---|
| DEFAULT | 10% | 20% |
| net1 | 10% | 20% |
| net2 | 30% | 30% |
| net3 | 5grid | 20grid |
| net4 | 5μm | 10μm |
| | | |

| NET TYPE | HORIZONTAL ENLARGEMENT | VERTICAL ENLARGEMENT |
|---|---|---|
| DEFAULT | 10% | 20% |
| kind1 | 10% | 20% |
| kind2 | 30% | 30% |
| kind3 | 5grid | 20grid |
| kind4 | 5μm | 10μm |
| | | |

| WIRING LAYER | HORIZONTAL ENLARGEMENT | VERTICAL ENLARGEMENT |
|---|---|---|
| DEFAULT | 10% | 20% |
| MET1 | 10% | 20% |
| MET2 | 30% | 30% |
| MET3 | 5grid | 20grid |
| MET4 | 5μm | 10μm |
| | | |

| CELL NAME | HORIZONTAL ENLARGEMENT | VERTICAL ENLARGEMENT |
|---|---|---|
| AAA | 10% | 20% |

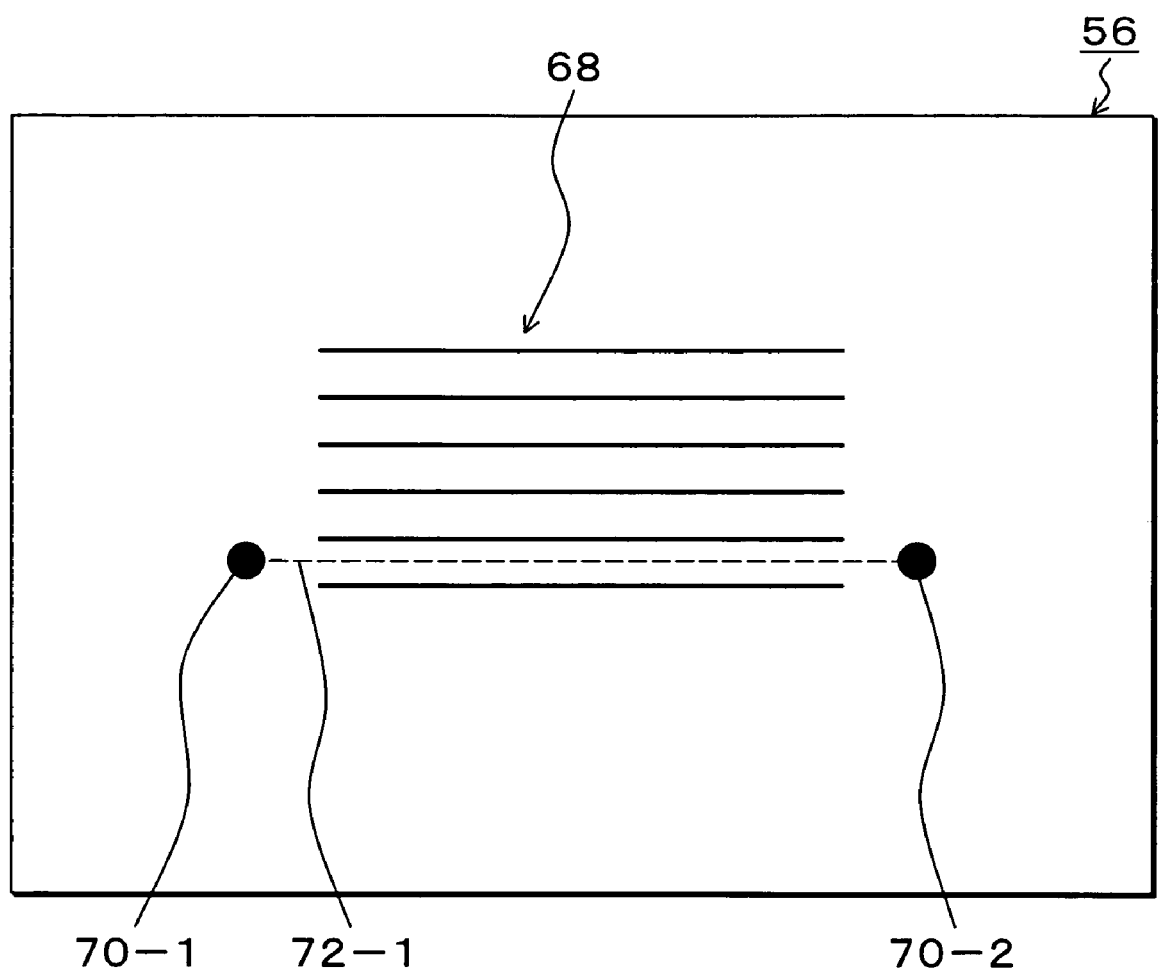

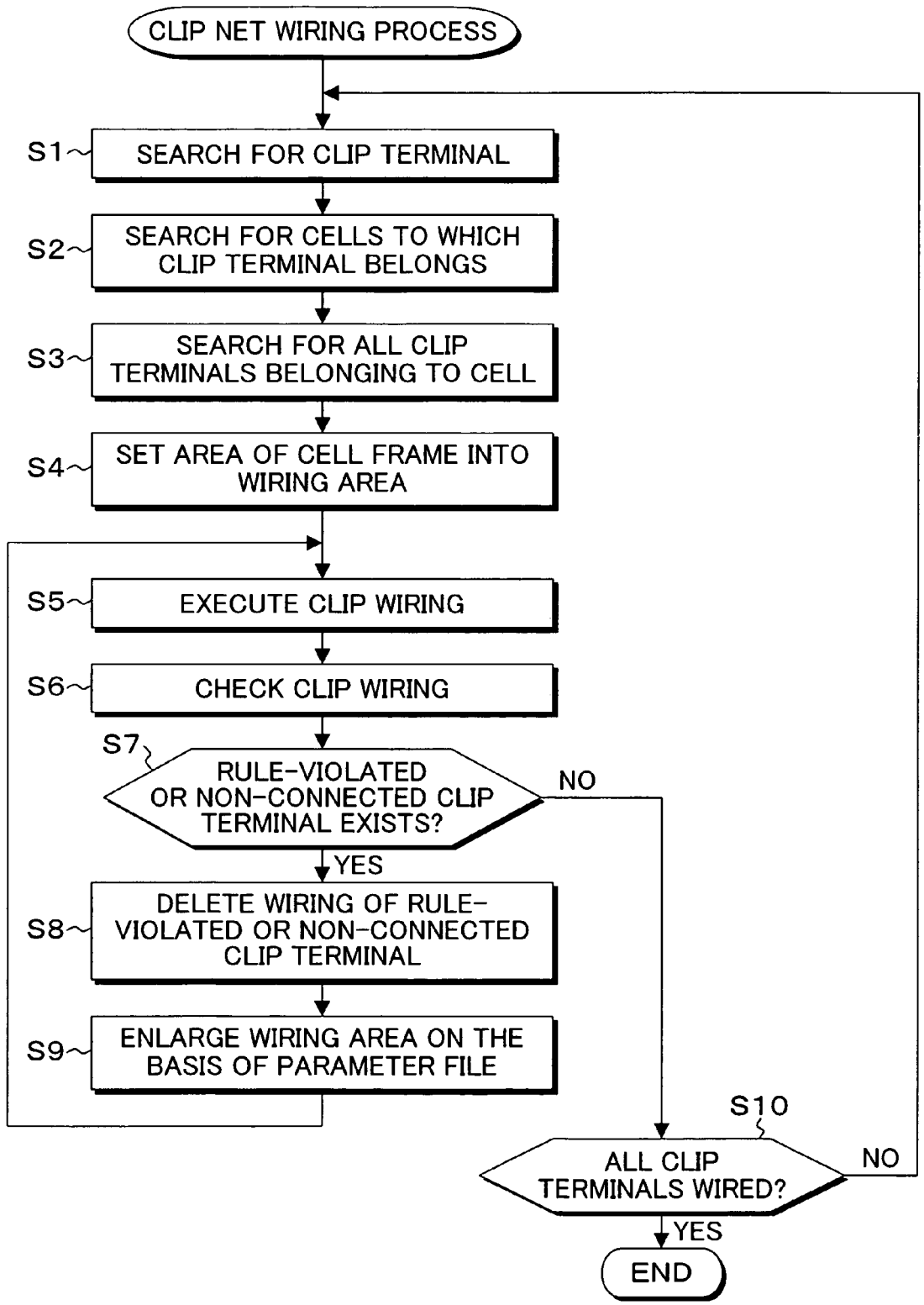

WIRING METHOD, PROGRAM, AND APPARATUS

This application is a priority based on prior application No. JP 2004-343337, filed on Nov. 29. 2004, in Japan incorporated by reference herein.

BACKGROUND OF THE INVENTION

1. Field of the Invention

The invention relates to wiring method, program, and apparatus in a layout design of an LSI and, more particularly, to wiring method, program, and apparatus which enable a high-speed wiring process at a high density.

2. Description of the Related Arts

In recent years, with respect to an LSI designing system, a high-density designing system is required by micro miniaturization of a transistor size and a high-speed designing system which finishes a design in a shorter period of time is required by shortening a developing cycle. In association with it, automatic wiring of a high density and a high speed is demanded also in an automatic wiring system in the LSI designing system. In the automatic wiring system, the line connection among devices arranged by net information is processed so as to satisfy a designing rule and various restricting conditions and, ordinarily, it is processed separately with respect to global wiring and detailed wiring. According to the global wiring, each net is divided into specific wiring areas and the wirings are allocated, and which wiring area is used while avoiding a local jam is determined. According to the detailed wiring, actual wiring of each net is made and the nets between two points or among multi-points are sequentially wired one by one at the shortest distance. A labyrinth method, a line segment searching method, a channel wiring method, or the like is used as a wiring algorithm.

In the detailed wiring of such a conventional automatic wiring system, a method of setting the whole surface of a chip to a wiring area is used with respect to the wiring of one net.

Refer to JP-A-5-181936, JP-A-6-124321, JP-A-5-160375, JP-A-5-243383, JP-A-9-147009, JP-A-10-189746, and JP-A-2003-303217.

However, in such a conventional automatic wiring system, since the whole surface of the chip is set to the wiring area with respect to the wiring of one net, a wiring process according to the wiring algorithm such as labyrinth method, line segment searching method, channel wiring method, or the like is executed to the wide area of the whole chip surface as a target. Therefore, a processing time of the automatic wiring becomes long. When considering also the case where the wiring process is unsuccessful and, for example, the design is retried from an upstream such as a logic design or the like, there is such a problem that a TAT (Turn Around Time) of the LSI design itself is extended because it takes time for the automatic wiring.

SUMMARY OF THE INVENTION

According to the invention, wiring method, program, and apparatus in which wiring is efficiently completed in a short time by giving a restriction to a wiring area upon wiring of one net are provided.

The invention provides a wiring method for a general net as a target. According to the invention, the wiring method of deciding wiring on a net unit basis with respect to a semiconductor circuit comprises:

a wiring area setting step wherein a maximum rectangle including a set of terminals constructing a net is set into a wiring area;

a wiring deciding step wherein wiring between the nets is decided so as to realize the shortest distance for the wiring area as a target; and a wiring area enlarging step wherein, if it is decided in the wiring deciding step that the non-connected terminal or a rule violation exists, the present wiring area is enlarged in accordance with a preset parameter and, thereafter, the wiring is decided in the wiring deciding step.

The invention provides a wiring method for a clip net as a target. According to the invention, the wiring method of the clip net in which in the case where one of a plurality of input terminals having a same function of cells arranged in a semiconductor circuit is used, the non-used input terminals are wired as clip terminals to power terminals, comprises:

a wiring area setting step wherein a cell area is set into a wiring area;

a wiring deciding step wherein wiring between the clip terminal and the power terminal is decided so as to realize the shortest distance for the wiring area as a target; and a wiring area enlarging step wherein, if it is decided in the wiring deciding step that the non-connected clip terminal or a rule violation exists, the present wiring area is enlarged in accordance with a preset parameter and, thereafter, the wiring is decided in the wiring deciding step.

The parameter which is used in the wiring area enlarging step includes a default enlarging function for all nets as targets. The parameter which is used in the wiring area enlarging step includes a different enlarging function in accordance with a type of net. In the parameter which is used in the wiring area enlarging step, the enlarging function regarding a specific net can be set to zero.

The parameter which is used in the wiring area enlarging step includes a different enlarging function in accordance with a wiring layer. An enlarging function of the parameter which is used in the wiring area enlarging step is an enlargement ratio, the number of grids, or an increase dimension. The parameter which is used in the wiring area enlarging step is an enlarging function of both or either of the horizontal direction and the vertical direction of the rectangular wiring area.

The invention provides a program for a general net as a target which is executed by a computer. The program according to the invention allows the computer to execute:

a wiring area setting step wherein a maximum rectangle including a set of terminals constructing a net is set into a wiring area;

a wiring deciding step wherein wiring between the nets is decided so as to realize the shortest distance for the wiring area as a target; and a wiring area enlarging step wherein, if it is decided in the wiring deciding step that the non-connected terminal or a rule violation exists, the present wiring area is enlarged in accordance with a preset parameter and, thereafter, the wiring is decided in the wiring deciding step.

The invention provides a wiring program for a clip net as a target which is executed by a computer. The wiring program according to the invention allows the computer to execute:

a wiring area setting step wherein a cell area having clip terminals serving as non-used input terminals in the case where one of a plurality of input terminals having a same function is used and power terminals is set into a wiring area;

a wiring deciding step wherein wiring between the clip terminal and the power terminal is decided so as to realize the shortest distance for the wiring area as a target; and a wiring area enlarging step wherein, if it is decided in the wiring deciding step that the non-connected clip terminal or a rule violation exists, the present wiring area is enlarged in accordance with a preset parameter and, thereafter, the wiring is decided in the wiring deciding step.

The invention provides a wiring apparatus for a general net as a target. According to the invention, the wiring apparatus for deciding wiring on a net unit basis with respect to a semiconductor circuit comprises:

a wiring area setting unit which sets a maximum rectangle including a set of terminals constructing a net into a wiring area;

a wiring deciding unit which decides the wiring between the nets so as to realize the shortest distance for the wiring area as a target; and a wiring area enlarging unit which, if it is decided in the wiring deciding unit that a non-connected terminal or a rule violation exists, enlarges the present wiring area in accordance with a preset parameter and, thereafter, allows the wiring deciding unit to decide the wiring.

The invention provides a wiring apparatus for a clip net as a target. According to the invention, the wiring apparatus for the clip net in which in the case where one of a plurality of input terminals having a same function of cells arranged in a semiconductor circuit is used, the non-used input terminals are wired as clip terminals to power terminals comprises:

a wiring area setting unit which sets a cell area into a wiring area;

a wiring deciding unit which decides the wiring between the clip terminal and the power terminal so as to realize the shortest distance for the wiring area as a target; and a wiring area enlarging unit which, if it is decided in the wiring deciding unit that the non-connected clip terminal or a rule violation exists, enlarges the present wiring area in accordance with a preset parameter and, thereafter, allows the wiring deciding unit to decide the wiring.

Details of the wiring program and the wiring apparatus according to the invention are fundamentally the same as those of the wiring method of the invention.

According to the invention, when one net is wired, by giving a restriction to the wiring area and processing it, the wiring process can be finished in the necessary minimum wiring area. As compared with the case where the wiring area is set to the whole chip surface, the wiring process can be efficiently executed and finished in a short time. For example, with respect to the general net, the maximum rectangle of the set of terminals constructing the net is used as a wiring area and the wiring is decided. If the non-connected terminal or the rule violation exists, while enlarging the present wiring area by the preset parameter, the wiring process is repeated until the non-connected terminal or the rule violation is eliminated. Thus, the efficient wiring process in which the minimum area which can be wired is always set to the wiring area can be executed.

With respect to the wiring of the clip net in which the clip terminals of the cells are connected to the power terminals as well, the wiring is decided while using the cell area as a wiring area. If the non-connected clip terminal or the rule violation exists, while enlarging the present wiring area by the preset parameter, the wiring process is repeated until the non-connected clip terminal or the rule violation is eliminated. Thus, the efficient wiring process in which the minimum area which can be wired is always set to the wiring area can be executed. Ordinarily, in a VLSI, the number of clip terminals is very large to be 1 to 2 millions. By enclosing the wiring area of the clip terminals into the cell, a load of the wiring process can be remarkably reduced.

As a parameter which is used to enlarge the wiring area, a severe enlargement ratio is set with respect to a clock net and a gentle enlargement ratio is set with respect to a scan net, thereby enabling the enlargement ratio of the wiring area in the case where the non-connected terminals remain to be controlled in accordance with the type of net. Further, it is also possible to use a method whereby as a parameter which is used to enlarge the wiring area, with respect to the net in which a severe circuit design is required, the parameter for the enlargement is set to zero and even if the non-connected terminal or the rule violation exists, the enlargement of the wiring area is not permitted but the wiring process is made to fail, thereby retrying the design from the upstream design such as a logic design or the like.

The above and other objects, features, and advantages of the present invention will become more apparent from the following detailed description with reference to the drawings.

BRIEF DESCRIPTION OF THE DRAWINGS

FIGS. 4A to 4D are explanatory diagrams of parameter files in FIG. 2;

FIGS. 7A and 7B are explanatory diagrams of the wiring process according to the invention for terminals arranged on a straight line as targets;

FIG. 14 is a flowchart for the wiring process according to the invention for the clip net as a target.

DETAILED DESCRIPTION OF THE PREFERRED EMBODIMENT

Figure 1:
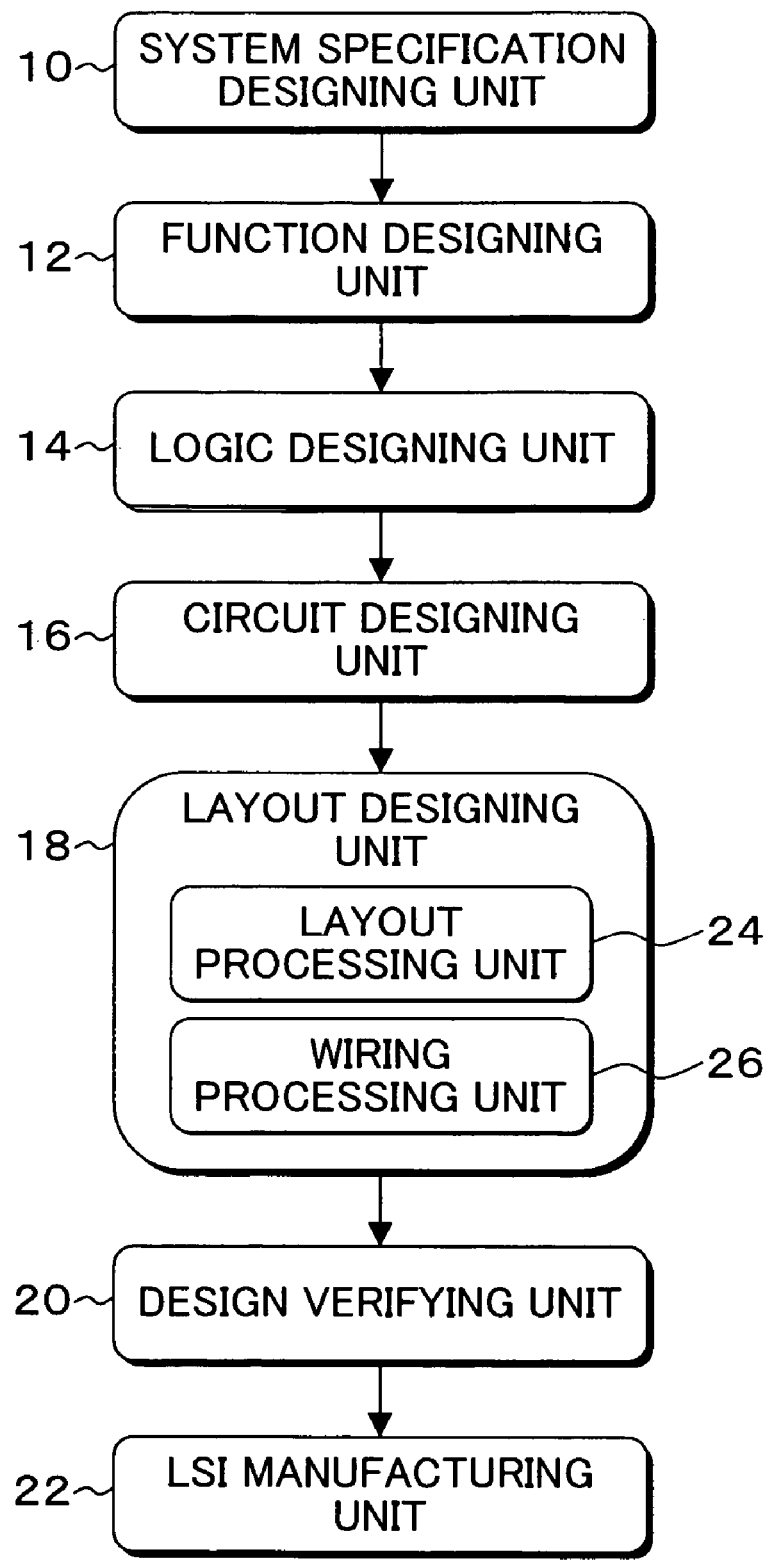
FIG. 1 is a block diagram of a whole construction of an LSI designing system.

FIG. 1 is a block diagram of a whole construction of an LSI designing system to which a wiring method of the invention is applied. In FIG. 1, the LSI designing system comprises: a system specification designing unit 10; a function designing unit 12; a logic designing unit 14; a circuit designing unit 16; a layout designing unit 18; a design verifying unit 20; and an LSI manufacturing unit 22. Among them, a layout processing unit 24 and a wiring processing unit 26 are provided for the layout designing unit 18. The wiring method of the invention is applied to the wiring processing unit 26. The system specification designing unit 10 determines into which functional blocks the whole system is divided and how it operates in order to realize a target system specification of an LSI. An operation simulator or a system simulator is used to examine validity of a design result.

The function designing unit 12 makes a design at a register transfer level (RT level) for deciding an internal structure and the operation of a functional block. A function simulator is used to verify the design result. The logic designing unit 14 designs a logic circuit at a gate level. A logic simulator, a timing simulator, or the like is used to confirm the operation. The circuit designing unit 16 designs a transistor circuit. A circuit simulator is used to examine characteristics of the designed circuit. The layout designing unit 18 executes a process for converting a circuit diagram into a layout wiring of a device having a physical shape and dimensions and a layout, a wiring program, and the like corresponding to an automatic design are used. The layout processing unit 24 in the layout designing unit 18 decides a shape of a device such as transistor, cell, or the like having actual physical dimensions and its layout position from logical information such as logic circuit or transistor circuit.

The wiring processing unit 26 provided for the layout designing unit 18 decides the wiring among the devices arranged by the layout processing unit 24 so as to satisfy a design rule and various restricting conditions. A method of dividing the line connection into two stages of global wiring and detailed wiring is ordinarily used as a wiring method. The invention is applied to the detailed wiring between them. According to the detailed wiring, actual wiring of each net is made and the nets between two points or among multi-points are sequentially wired one by one at the shortest distance. A labyrinth method, a line segment searching method, a channel wiring method, or the like is used as a wiring algorithm.

The design verifying unit 20 executes the following processes: a design rule check (DRC) to examine rule violation of the design dimensions with respect to the designed layout; a line connection check to examine a circuit extraction and line connection error for forming circuit line connection information from the layout; an electric rule check to examine dimension requesting characteristics of the transistor, the presence or absence of a short-circuit of a power wiring, etc.; and the like. When the design verification is finished, mask data is formed and transferred to the LSI manufacturing unit 22 and an LSI is manufactured.

Figure 2:
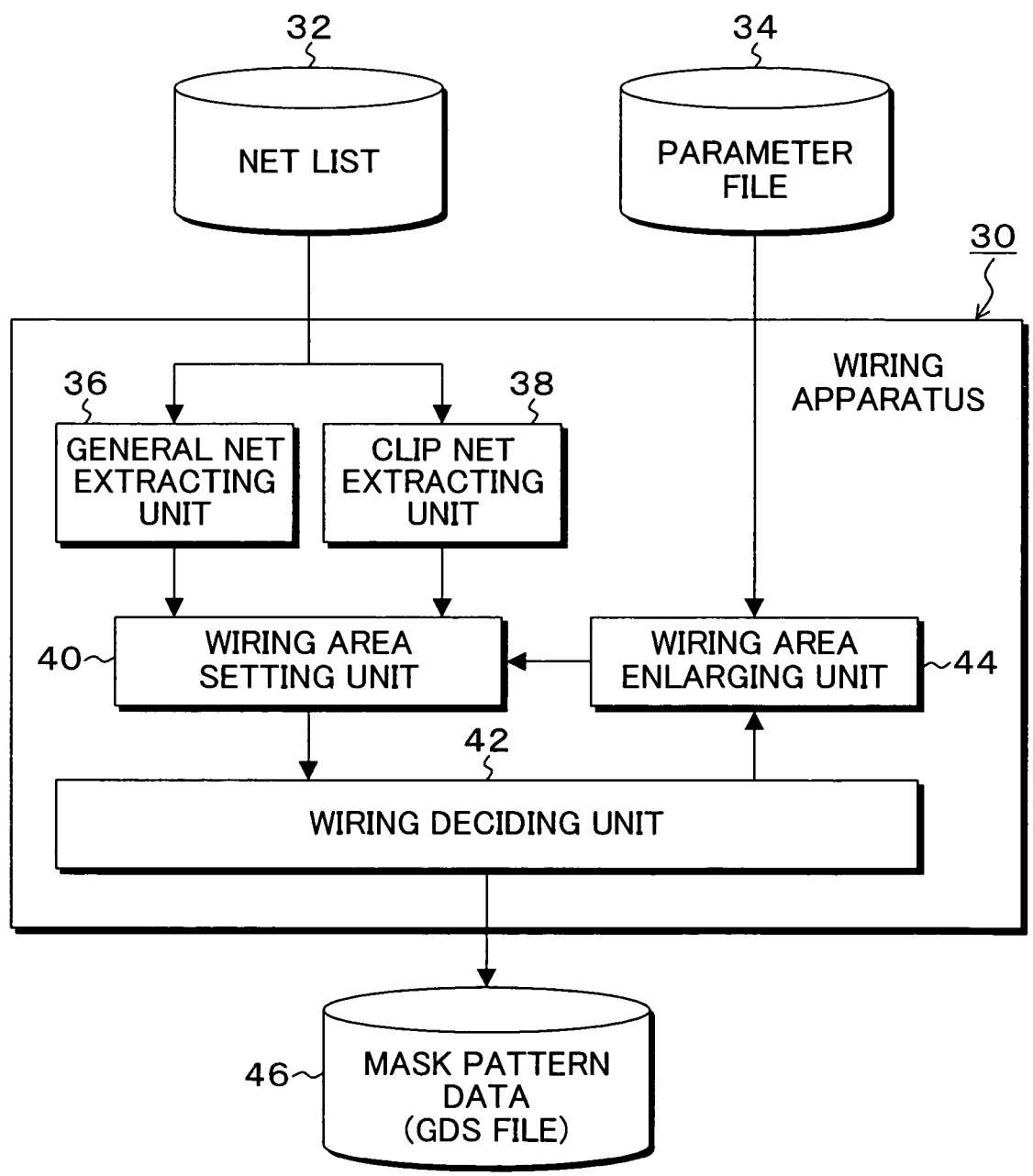
FIG. 2 is a block diagram of a functional construction of a wiring apparatus according to the invention.

FIG. 2 is a block diagram of a functional construction of a wiring apparatus according to the invention. In FIG. 2, a net list 32 is provided for a wiring apparatus 30 of the invention. Net list information obtained after the design was finished in the circuit designing unit 16 as shown in FIG. 1 has been stored in the net list 32. A parameter file 34 is provided for the wiring apparatus 30. As will be clearly explained hereinafter, a parameter as an expanding function which is used for the enlargement of the wiring area in the wiring process of the invention has previously been stored in the parameter file 34.

The wiring apparatus 30 comprises functional blocks of: a general net extracting unit 36; a clip net extracting unit 38; a wiring area setting unit 40; a wiring deciding unit 42; and a wiring area enlarging unit 44. Layout design data obtained after the process in the wiring apparatus 30 is outputted as mask pattern data 46 after the design verification. The general net extracting unit 36 provided for the wiring apparatus 30 selects wiring nets excluding the clip net from the net list 32 and outputs them to the wiring area setting unit 40. The clip net extracting unit 38 searches for a cell including the clip terminals from the net list 32 and outputs it to the wiring area setting unit 40.

The wiring area setting unit 40, the wiring deciding unit 42, and the wiring area enlarging unit 44 executes the wiring process separately with respect to the general net and the clip net. In the case of the general net, the wiring area setting unit 40 sets the maximum rectangle, as a wiring area, including a set of terminals constructing the net. The wiring deciding unit 42 decides the wiring between the nets so as to realize the shortest distance for the wiring area, as a target, decided by the wiring area setting unit 40. As for the decision of the wiring between the nets, the labyrinth method or the line segment searching method is used to decide the wiring path between two points. On the other hand, for example, the channel wiring method is used to decide the wiring paths among the multi-points.

With respect to the result of the wiring process by the wiring deciding unit 42, if a violation (rule violation) or a non-connected terminal exists, the wiring area enlarging unit 44 enlarges the present wiring area in accordance with a parameter stored in the parameter file 34 and, thereafter, allows the wiring deciding unit 42 to execute the process for deciding the wiring. The enlargement of the wiring area by the wiring area enlarging unit 44 is repetitively executed until the wiring is successfully completed in a range of the parameter set in the parameter file 34. As a parameter which is used to enlarge the wiring area and has been stored in the parameter file 34, an enlargement ratio (%), the number of grids, an increase dimension (μm), or the like is used.

As a violation (rule violation) which is used to discriminate the wiring result in the wiring deciding unit 42, the following two rules are fundamentally used.
(1) Spacing Rule
(2) Cross Rule The case of the clip net will now be described. The clip net denotes a wiring process in which with respect to the cells arranged in the LSI chip, if the cell has a plurality of input terminals having the same function, in the case where one of them is selected and used, the non-used residual input terminals are used as clip terminals and these clip terminals are wired to power terminals in the cells. For example, the following situation can be mentioned: that is, in the case where there are three input terminals having the same function with respect to a certain cell and their input capacities have different values such as 40 pF, 60 pF, and 80 pF, the input terminal of 40 pF is used and the residual input terminals of 60 pF and 80 pF are connected as clip terminals to the power terminals and connected to the ground.

In the case of the wiring process for such a clip net as a target, the wiring area setting unit 40 sets the area of the cell including the clip terminals extracted by the clip net extracting unit 38 into the wiring area. The wiring deciding unit 42 decides the wiring between the clip terminal and the power terminal so as to realize the shortest distance for the cell area, as a target, which has been set as a wiring area. Thus, with respect to the clip net, so long as an inhibiting area does not exist in the cell, the wiring can be suppressed to the wiring in the cell as a principle. In the wiring area enlarging unit 44, with respect to the wiring result by the wiring deciding unit 42, a violation check of the spacing and the crossing is made and the presence or absence of the non-connected clip terminals is discriminated. If the violation or the non-connected clip terminals are found, the wiring area set with respect to the present cell area is enlarged in accordance with the parameter set in the parameter file 34, thereafter, the wiring is performed again and the wiring of the clip net is determined in the wiring deciding unit 42.

Figure 3:
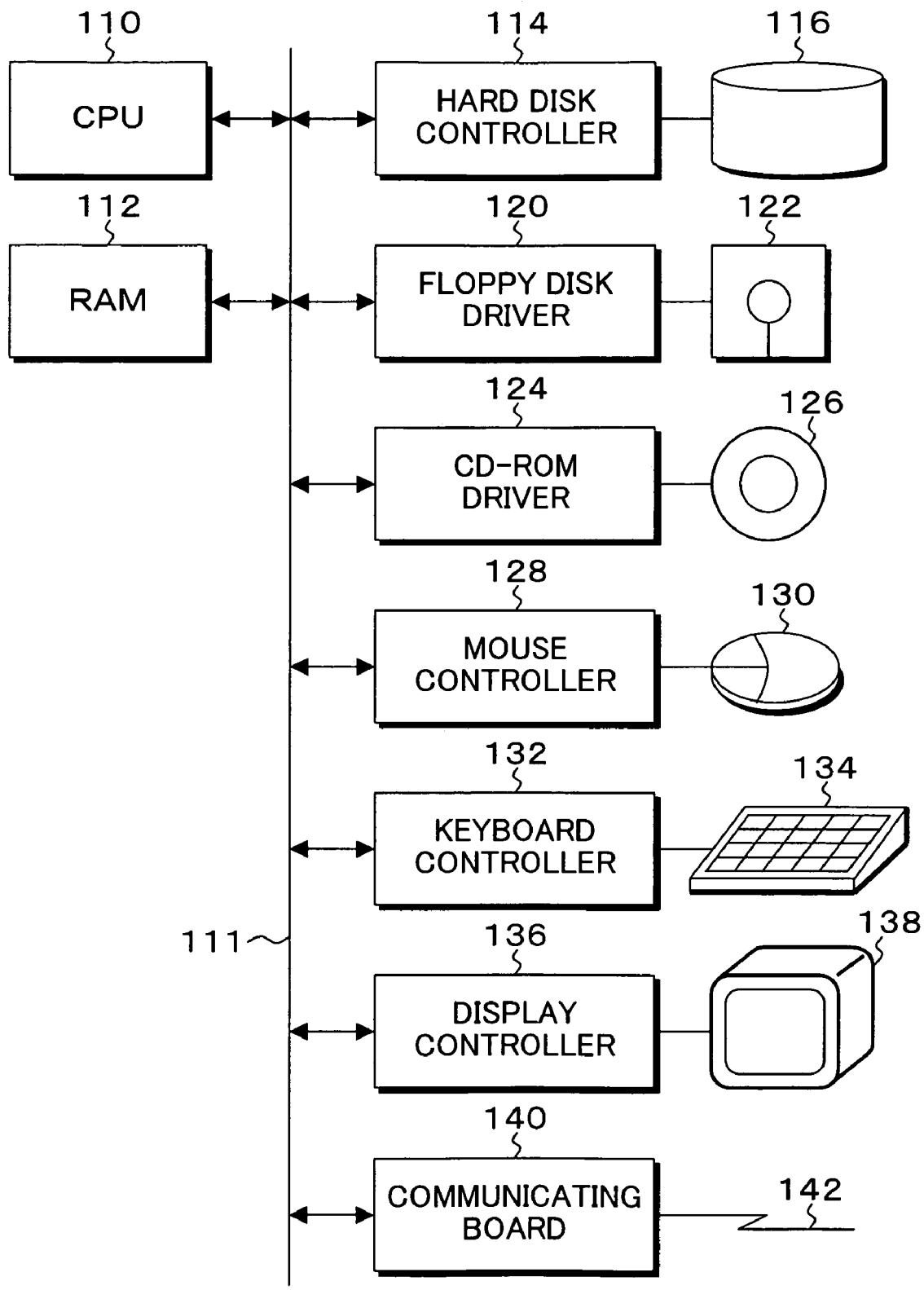
FIG. 3 is an explanatory diagram of a hardware environment of a computer to which the wiring apparatus of FIG. 2 is applied.

The wiring apparatus 30 in FIG. 2 is realized by, for example, hardware resources of a computer as shown in FIG. 3. In the computer in FIG. 3, a RAM 112, a hard disk controller (software) 114, a floppy disk driver (software) 120, a CD-ROM driver (software) 124, a mouse controller 128, a keyboard controller 132, a display controller 136, and a communicating board 140 are connected to a bus 111 of a CPU 110. A hard disk drive 116 is connected to the hard disk controller 114. Programs to execute the wiring process of the invention have been loaded in the hard disk controller 114. When the computer is activated, the necessary program is called from the hard disk drive 116, developed into the RAM 112, and executed by the CPU 110.

A floppy disk drive (hardware) 122 is connected to the floppy disk driver 120 and data can be written and read out into/from a floppy disk (registered trademark). A CD drive (hardware) 126 is connected to the CD-ROM driver 124 and data or programs stored in a CD can be read out. The mouse controller 128 transfers the inputting operation of a mouse 130 to the CPU 110. The keyboard controller 132 transfers the inputting operation of a keyboard 134 to the CPU 110. The display controller 136 allows a display unit 138 to display data. The communicating board 140 makes communication between an apparatus in the network and an external apparatus on the network via a LAN 142.

FIGS. 4A to 4C are explanatory diagrams of parameter information which is stored into the parameter file in FIG. 2. FIG. 4A shows a net name parameter file 48. Parameters of the horizontal enlargement and the vertical enlargement have been set as enlarging functions in correspondence to the net name. Net names net1 to net4 have been registered subsequent to a default.

Default horizontal enlargement is equal to 10% and default vertical enlargement is equal to 20% and they are applied to the general nets other than the nets of the net names net1 to net4. With respect to the net names net1 and net2, the horizontal enlargement and the vertical enlargement are shown by a percentage indication. With respect to the net name net3, a lattice grid in the layout design is used as a unit, the horizontal enlargement is equal to 5 grid, and the vertical enlargement is equal to 20 grid. In this manner, an area enlargement amount is defined by the number of grids. Further, with respect to the net name net4, the horizontal enlargement is equal to 5 μm and the vertical enlargement is equal to 10 μm. In this manner, increase dimensions of the area on the chip are defined. In the net name parameter file 48, although degrees of the horizontal enlargement and the vertical enlargement are set to the different values, they can be set to the same value. With respect to the net in which the enlargement of the wiring area cannot be permitted, the enlarging function of each of the horizontal enlargement and the vertical enlargement can be also set to zero. The setup for setting the enlarging functions to zero incorporates the case where either the horizontal enlargement or the vertical enlargement is set to zero.

FIG. 4B shows a net type parameter file 50 and this file is characterized in that the enlarging functions of the horizontal enlargement and the vertical enlargement of the wiring area are set in accordance with the net type. In the net type parameter file 50, the defaults are also applied to the nets other than net types Kind1 to Kind4. The enlarging function of each of the horizontal enlargement and the vertical enlargement is set to one of the percentage, the number of grids, and the increase dimension (μm). The net type is classified into a clock net of a severe electrical condition, a scan net of a gentle electrical condition, and the like.

FIG. 4C is an explanatory diagram of a wiring layer parameter file 52. Parameters serving as enlarging functions of the horizontal enlargement and the vertical enlargement of the wiring area are set separately with respect to each wiring layer. There are a default and MET1 to MET4 as wiring layers. The default parameters are used with respect to the wiring layers other than the wiring layers MET1 to MET4. The parameter of the enlarging function of each of the horizontal enlargement and the vertical enlargement is set to one of the percentage, the number of grids, and the increase dimension (μn).

FIG. 4D is an explanatory diagram of a parameter file 54 for a clip net. Although FIGS. 4A to 4C show the parameter files which are used to enlarge the wiring area for the general net as a target, FIG. 4D shows the parameter file which is used to enlarge the wiring area of the clip net in which clip terminals are connected to power terminals. An increase function of each of the horizontal enlargement and the vertical enlargement is set as an enlargement ratio (%) in correspondence to the cell name.

Figure 5A:
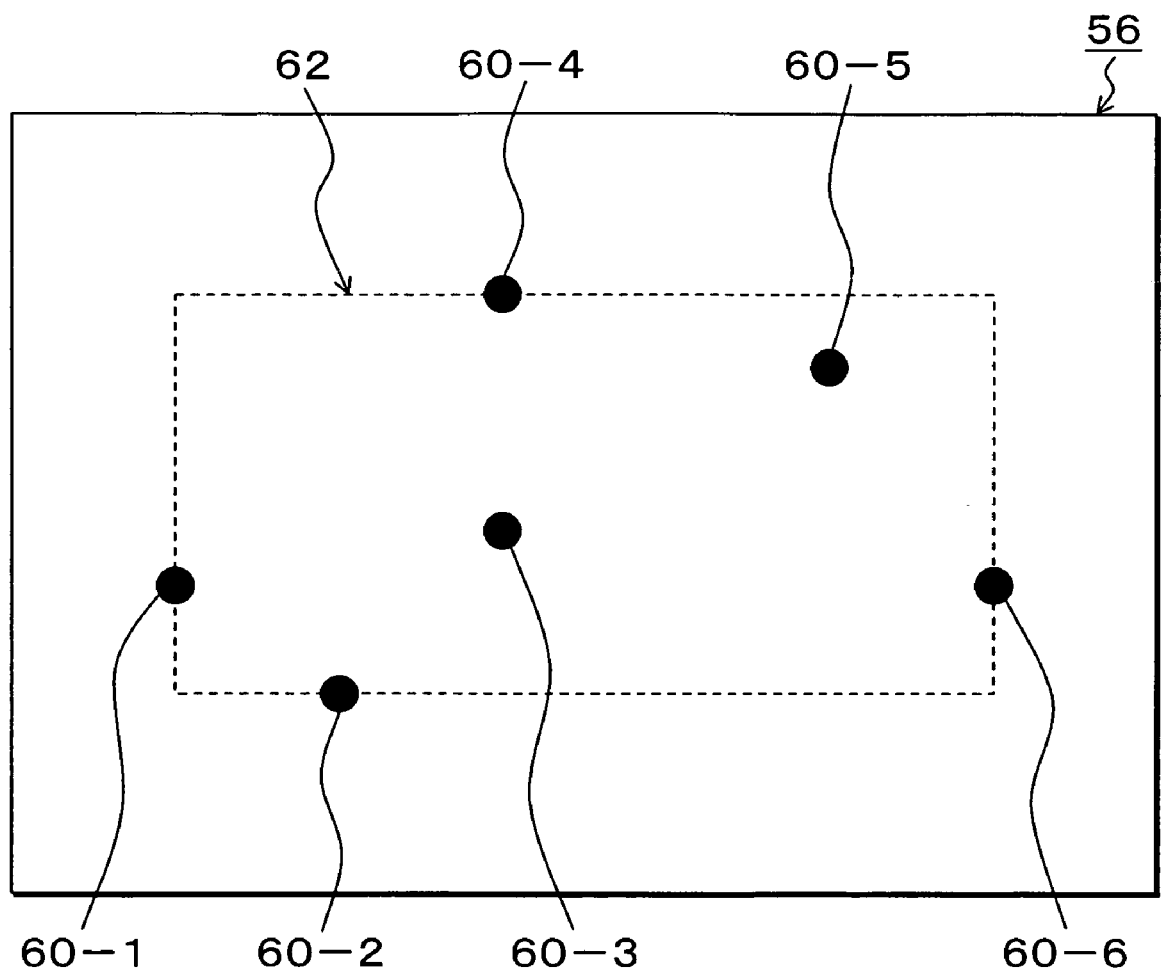
FIGS. 5A and 5B are explanatory diagrams of a wiring process for a general net as a target according to the invention.
Figure 5B:
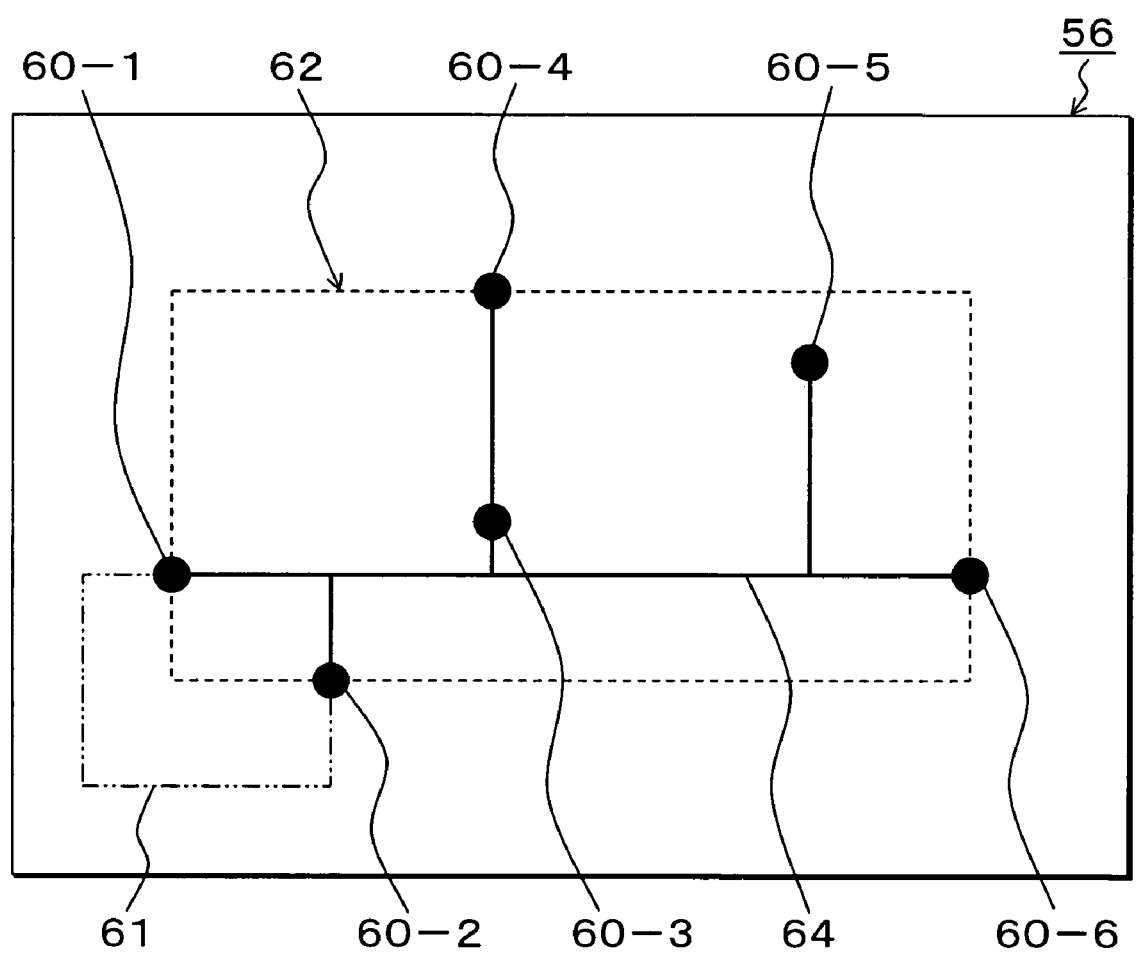

FIGS. 5A and 5B are explanatory diagrams of a wiring process for a general net as a target according to the invention. FIG. 5A shows the first wiring process. In the case where the wiring process is executed to a plurality of terminals 60-1 to 60-6 arranged in a chip 56 as targets, first, a wiring area 62 is set as a maximum rectangle including a set of the terminals 60-1 to 60-6. The wiring process is executed to the wiring area 62 set as shown in FIG. 5A as a target. A wiring 64 is set as shown in FIG. 5B. The wiring 64 connecting the terminals 60-1 to 60-6 is enclosed in the wiring area 62. On the other hand, in the conventional wiring process in which the whole chip 56 is set to the wiring area, for example, in the case where the inside of the wiring area is jammed to a certain degree as shown in the portions of the terminals 60-1, 60-2, and 60-3, empty channels are searched for and the wiring is performed to an area other than the rectangular area of the terminals of its own net as shown by a conventional wiring 61 in FIG. 5B so as to bypass such an area.

On the other hand, according to the invention, since the wiring 62 is enclosed in the wiring area 62 in a maximum rectangular shape which has been set to the set of the terminals, the generation of the bypass wiring can be minimized. Since it is sufficient to execute the wiring process with respect to a partial area of the chip 56 such as a wiring area 62 instead of the whole chip 56, a processing burden required for the wiring process decreases and the processing time can be shortened.

Figure 6A:
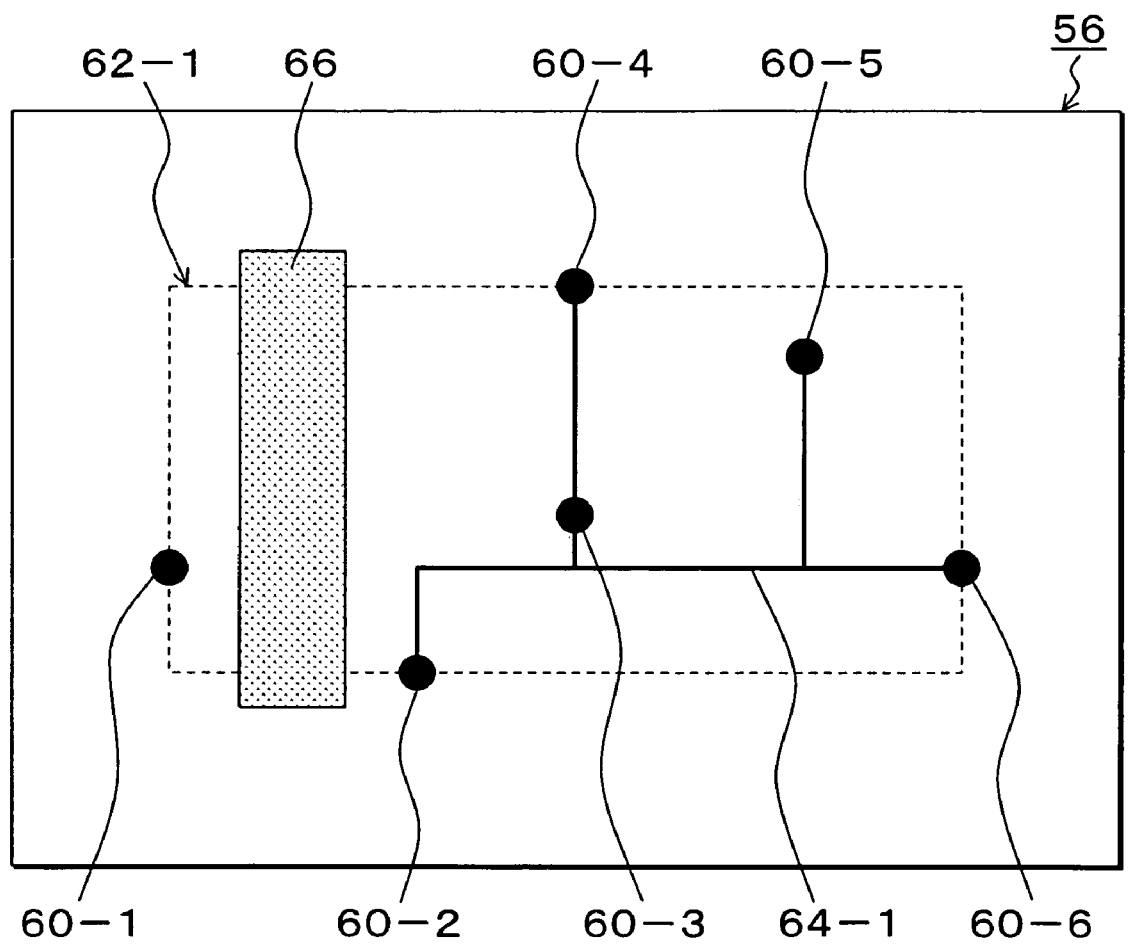
FIGS. 6A and 6B are explanatory diagrams of a wiring process according to the invention in the case where a wiring inhibiting area exists.
Figure 6B:
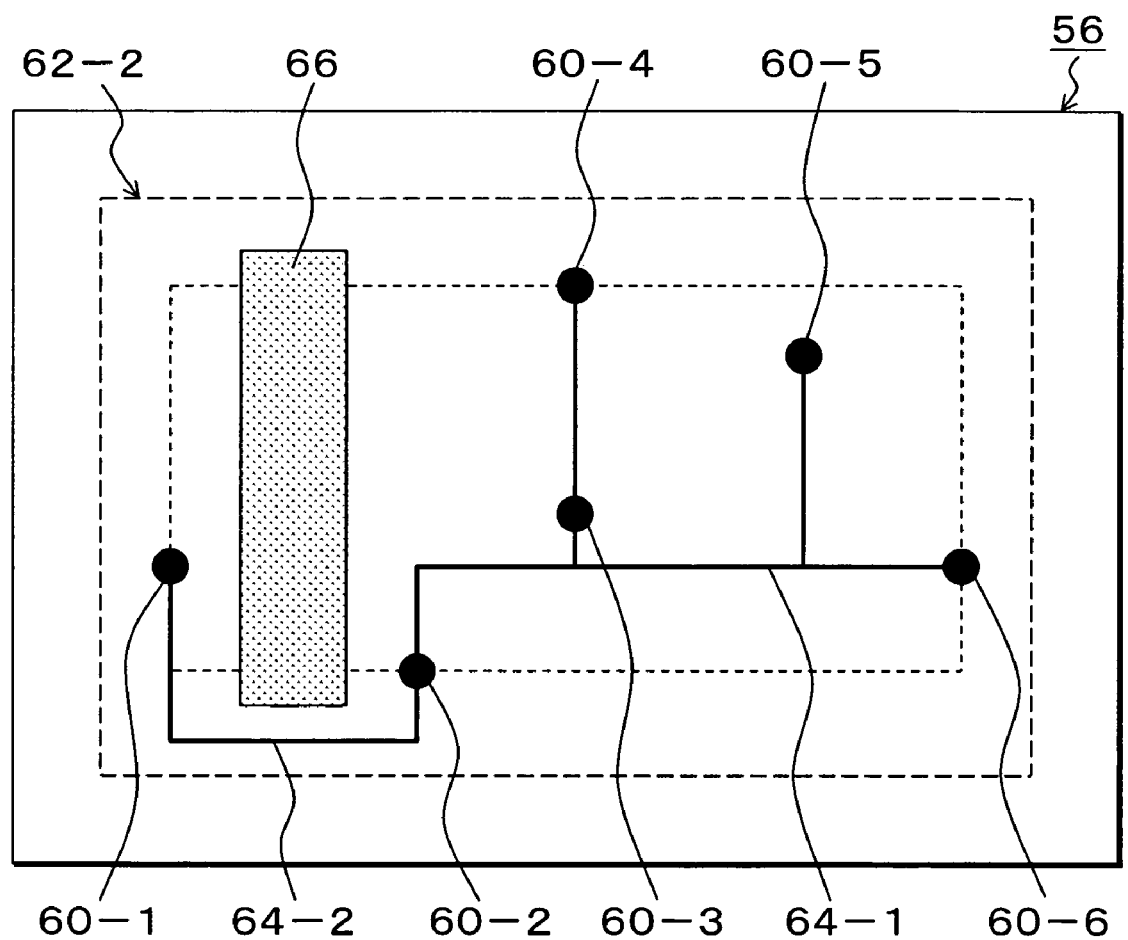

FIGS. 6A and 6B are explanatory diagrams of a wiring process according to the invention in the case where a wiring inhibiting area exists in the net. FIG. 6A shows the first wiring process. A wiring inhibiting area 66 exists in the net developed to the chip 56. In this case as well, first, a wiring area 62-1 in a maximum rectangular shape including the set of the terminals 60-1 to 60-6 is set, the wiring process is executed, and a wiring 64-1 is decided. However, when a wiring result is seen, the terminal 60-1 is not connected due to the existence of the wiring inhibiting area 66. In the invention, therefore, as shown in FIG. 6B, the wiring area 62-1 is enlarged like a wiring area 62-2 shown in FIG. 6B in accordance with the enlarging function obtained from the external parameter file 34. After that, the wiring process is executed again, a wiring 64-2 connecting the terminals 60-1 and 60-2 by bypassing the wiring inhibiting area 66 is decided, and the wiring process is finished.

Figure 7B:
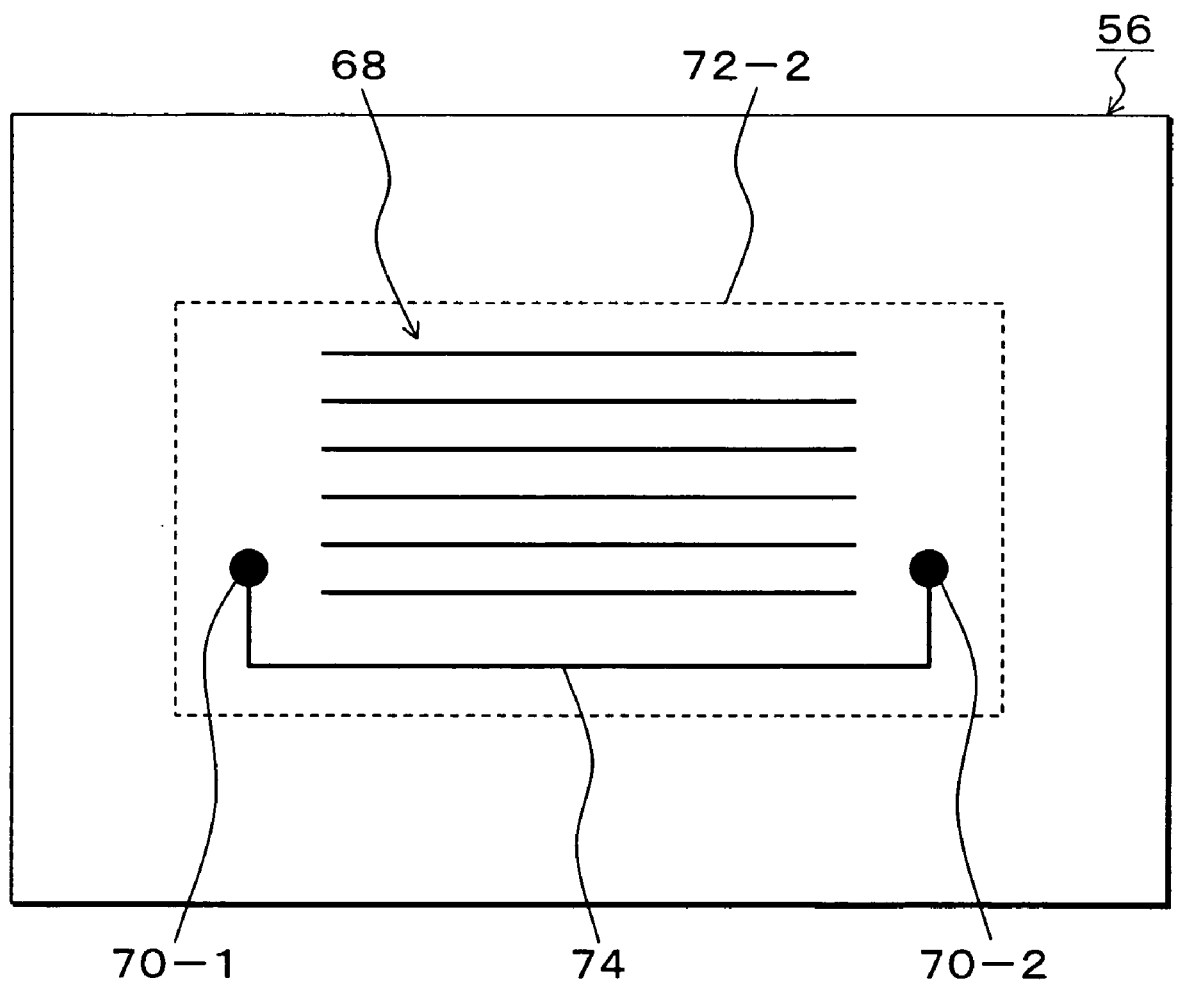

FIGS. 7A and 7B are explanatory diagrams of the wiring process according to the invention for terminals arranged on a straight line as targets as a special case. In the chip 56 in FIG. 7A, terminals 70-1 and 70-2 are arranged on both sides of wired lines 68 whose wiring process has already been finished. The terminals 70-1 and 70-2 are arranged on a straight line. In such a case as well, when a wiring area 72-1 in a maximum rectangular shape with respect to the terminals 70-1 and 70-2 is set, the wiring area 72-1 does not become the rectangular area but becomes a straight line. Since there is a possibility that the wiring cannot be performed with respect to the wiring area 72-1 which becomes the straight line, by executing the wiring process after it is enlarged to a rectangular wiring area like a wiring area 72-2 in FIG. 7B, a wiring 74 connecting the terminals 70-1 and 70-2 by bypassing the wired lines 68 can be decided.

The case where the wiring process according to the invention is applied to the labyrinth method as a wiring algorithm will now be specifically explained.

Figure 8:
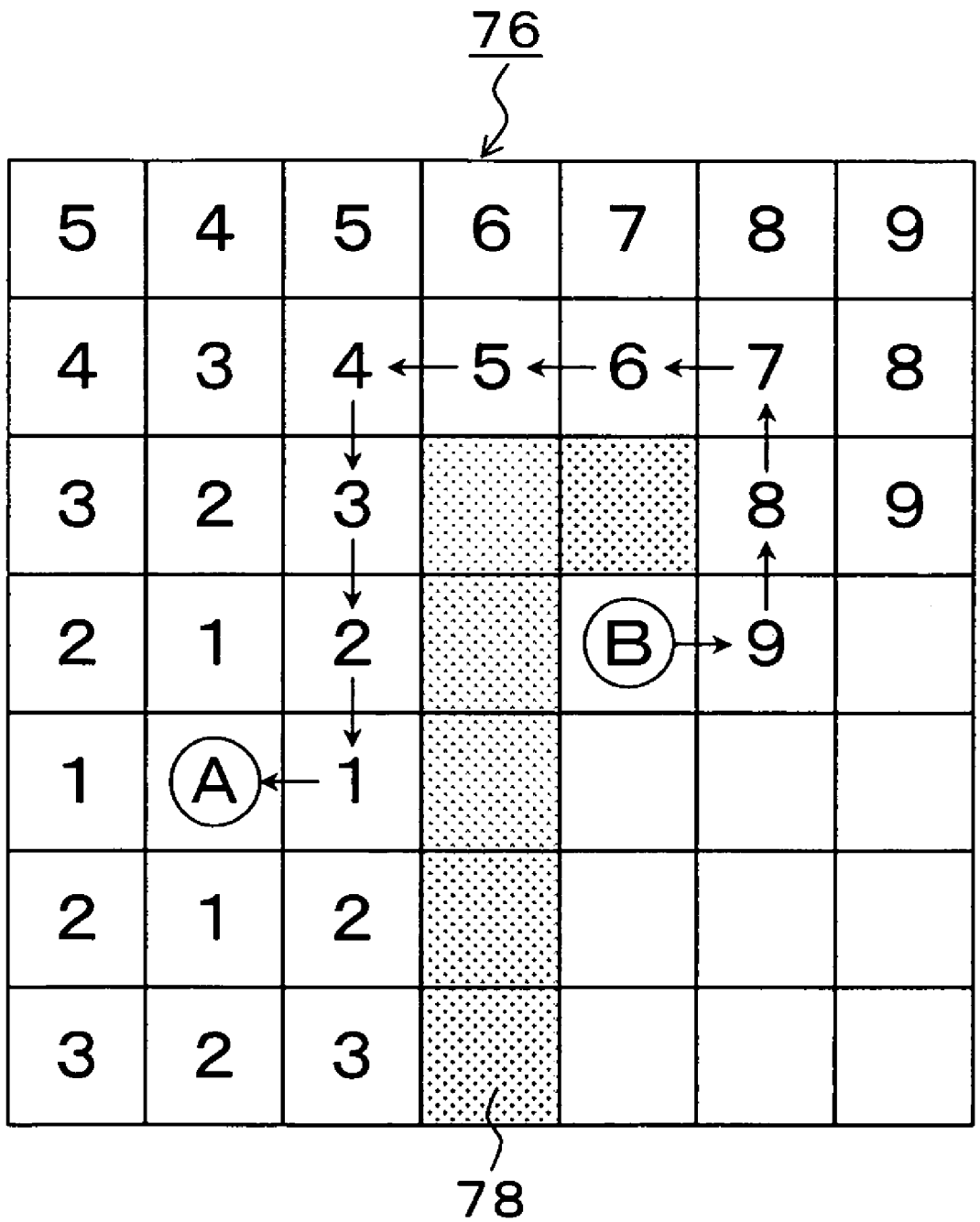
FIG. 8 is an explanatory diagram of a wiring process according to the conventional labyrinth method.

FIG. 8 is an explanatory diagram of a wiring process according to the conventional labyrinth method. According to the labyrinth method, a plane of a chip 76 to be wired is partitioned by a square lattice in which the sum of a wiring width and an interval between the lines is used as a distance between center points and a path connecting the center points of the lattice is found. FIG. 8 shows an example in the case of obtaining a wiring path of a starting terminal A and a target terminal B. First, "1" is labeled to four squares in the upper, lower, right, and left positions around the starting terminal A as a center. Subsequently, "2" is labeled to empty squares in the upper, lower, right, and left positions of "1". In a manner similar to the above, the squares to which large numerals have been labeled in order are formed so that a ripple is propagated when the numeral of the label reaches the target terminal B, by tracing the numerals of the labels from the target terminal B in the descending order, the shortest path reaching the starting terminal A is found as shown by arrows.

Figure 9A:
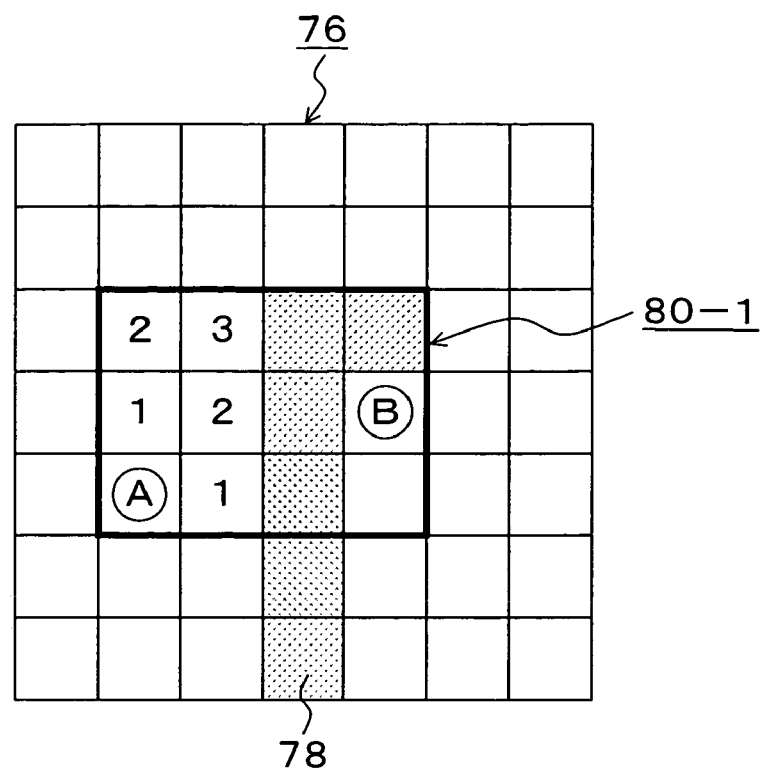
FIGS. 9A and 9B are explanatory diagrams of the wiring process according to the labyrinth method to which the invention is applied.
Figure 9B:
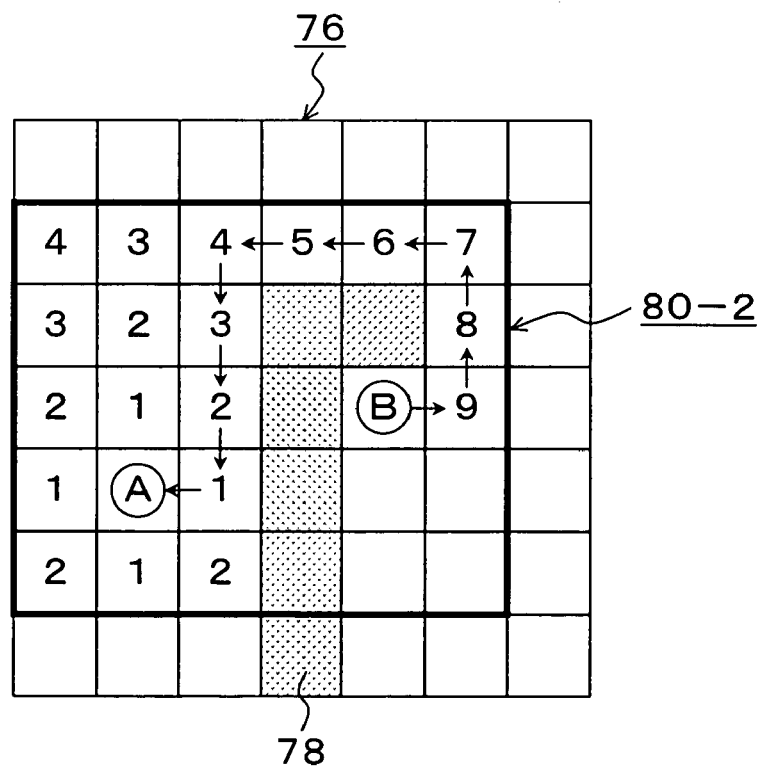

FIGS. 9A and 9B are explanatory diagrams of the wiring process according to the labyrinth method to which the invention is applied. In FIG. 9A, a wiring area 80-1 in a maximum rectangular shape is set for the starting terminal A and the target terminal B arranged with respect to the chip 76. In the wiring area 80-1, "1" is labeled to the upper, lower, right, and left positions around the starting terminal A as a center. Subsequently, "2" is labeled to the upper, lower, right, and left positions of the label "1" in the area. In a manner similar to the above, the above processes are repeated. However, in this case, the numeral does not reach the target terminal B in the wiring area 80-1 and the wiring fails. Therefore, as shown in FIG. 9B, if the processes in which the wiring area 80-1 is enlarged like a wiring area 80-2 in accordance with the parameter in the external parameter file 34 and, after that, the numeral of the label is increased in a manner similar to the above are repeated, the numeral finally reaches the target terminal B. By tracing the numerals of the labels from the target terminal B in the descending order, the wiring path reaching the starting terminal A is found as shown by arrows.

In the wiring process by the labyrinth method to which the invention is applied in FIGS. 9A and 9B, the numeral labeling process according to the labyrinth method is executed in the ranges of the wiring areas 80-1 and 80-2 set to the chip 76. As compared with the conventional example of FIG. 8, since the area where the numerals are set is restricted, a processing burden required to the searching process is reduced and the wiring process can be executed at a high speed.

Figure 10A:
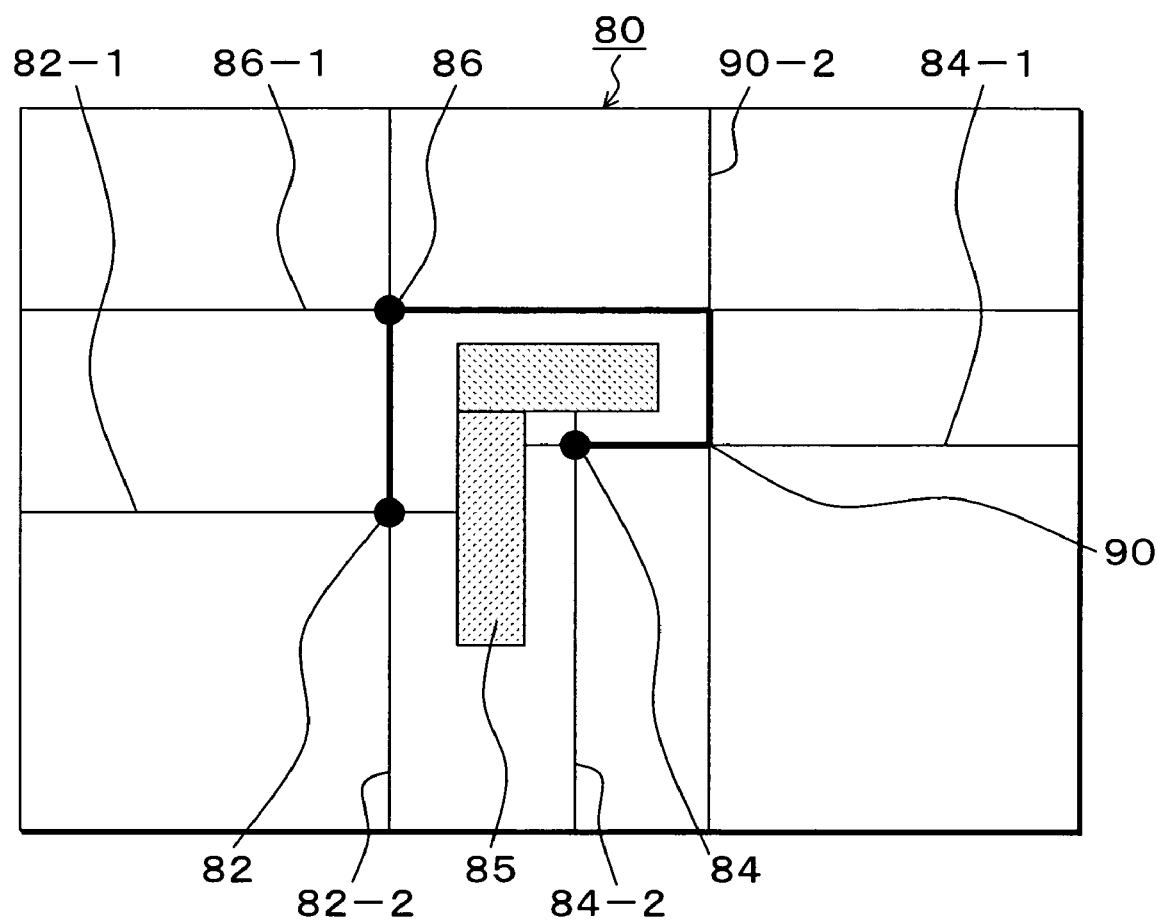
FIGS. 10A and 10B are explanatory diagrams of a wiring process according to the conventional line segment searching method and the wiring process according to the line segment searching method to which the invention is applied.
Figure 10B:
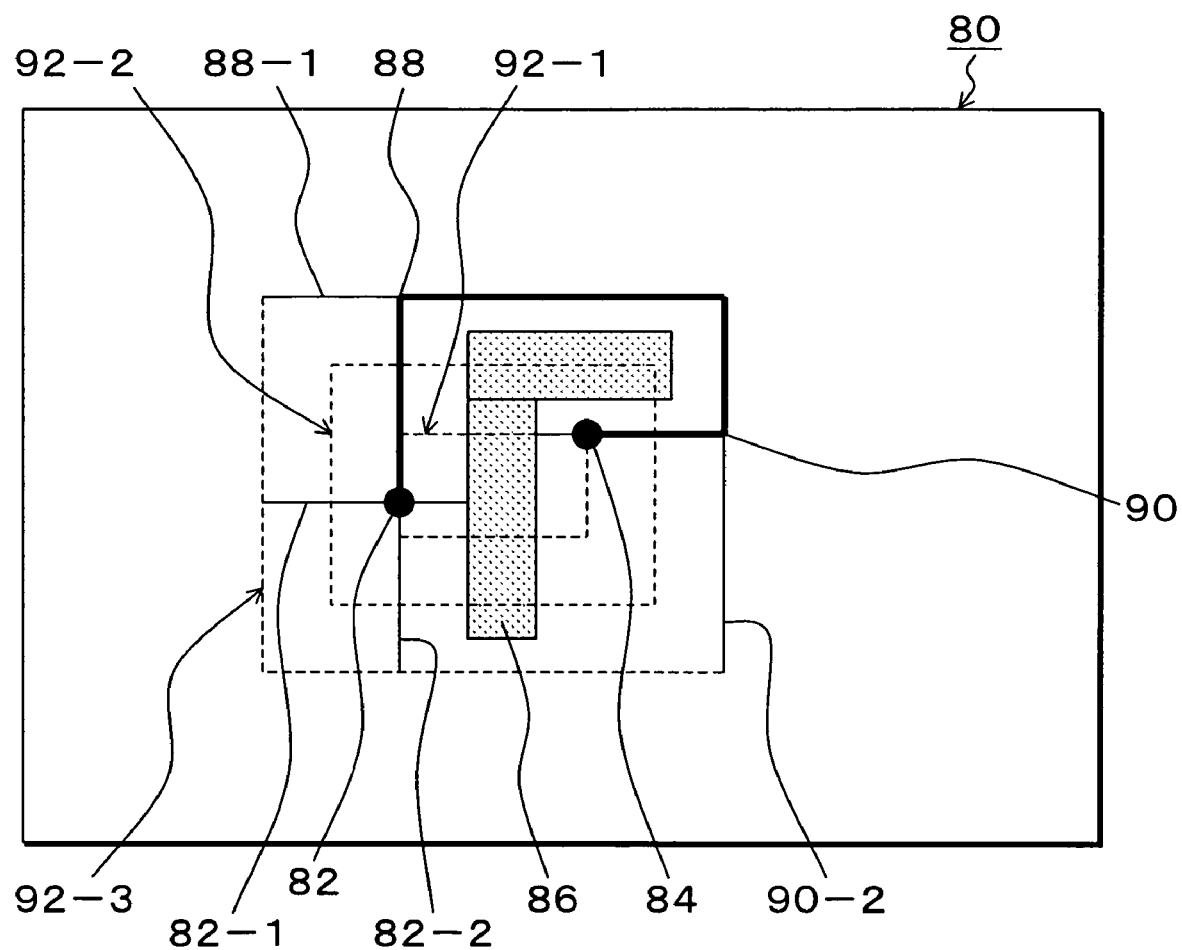

FIGS. 10A and 10B are explanatory diagrams of a wiring process according to the conventional line segment searching method and the wiring process according to the line segment searching method to which the invention is applied. FIG. 10A shows the wiring process according to the conventional line segment searching method. With respect to a starting terminal 82 and a target terminal 84 arranged in a chip 80, trial lines are extended from each of those terminals until it collides with a wiring inhibiting area 85 or an outer frame in four horizontal and vertical directions. That is, a horizontal trial line 82-1 and a vertical trial line 82-2 are extended from the starting terminal 82 and a horizontal trial line 84-1 and a vertical trial line 84-2 are extended from the target terminal 84, respectively. Subsequently, while a cross point is moved, for example, upward to the starting terminal 82 at a wiring interval, a horizontal trial line is set and a horizontal trial line 86-1 having a cross point 86 which avoids the wiring inhibiting area 85 is set.

With respect to the target terminal 84, a cross point is moved in the horizontal direction along the horizontal trial line 84-1 at the wiring interval and a vertical trial line 90-2 having a cross point 90 which avoids the wiring inhibiting area 85 is set. Since a cross point 88 of the horizontal trial line 86-1 which has sequentially been set from the starting terminal 82 side and the vertical trial line 90-2 starting from the target terminal 84 side is obtained, a wiring path connecting the starting terminal 82 and the target terminal 84 is determined.

FIG. 10B is the explanatory diagram of the wiring process according to the line segment searching method to which the invention is applied. A wiring area 92-1 in a maximum rectangular shape is set for the starting terminal 82 and the target terminal 84 at the first time. In this case, since the wiring fails, a wiring area 92-2 enlarged in accordance with the parameter in the parameter file 34 is set. In this case, since the wiring according to the line segment searching method also fails, a further enlarged wiring area 92-3 is set. In this case, the wiring path according to the line segment searching method can be set. With respect to such a line segment searching method, the cross point is also obtained by setting each of the horizontal and vertical trial lines for the whole chip 80 as a target in FIG. 10A. However, in the wiring process according to the invention in FIG. 10B, since the setting of the trial lines and the search of the cross points according to the line segment searching method are performed in the restricted areas like wiring areas 92-1, 92-2, and 92-3, a processing burden of the line segment searching method is reduced and the searching process can be executed in a short time.

With respect to the channel wiring method of deciding the wiring paths among a plurality of terminals as well, the process has been executed to the whole cell as a target hitherto. In the invention, however, the wiring area in a maximum rectangular shape is set to the set of the terminals, and if the wiring according to the channel wiring method fails with respect to such an area, by enlarging the wiring area by the parameter and executing the process, the wiring area is restricted, the processing burden can be reduced, and the processing time can be shortened. This is true of other proper wiring processing algorithms.

Figure 11:
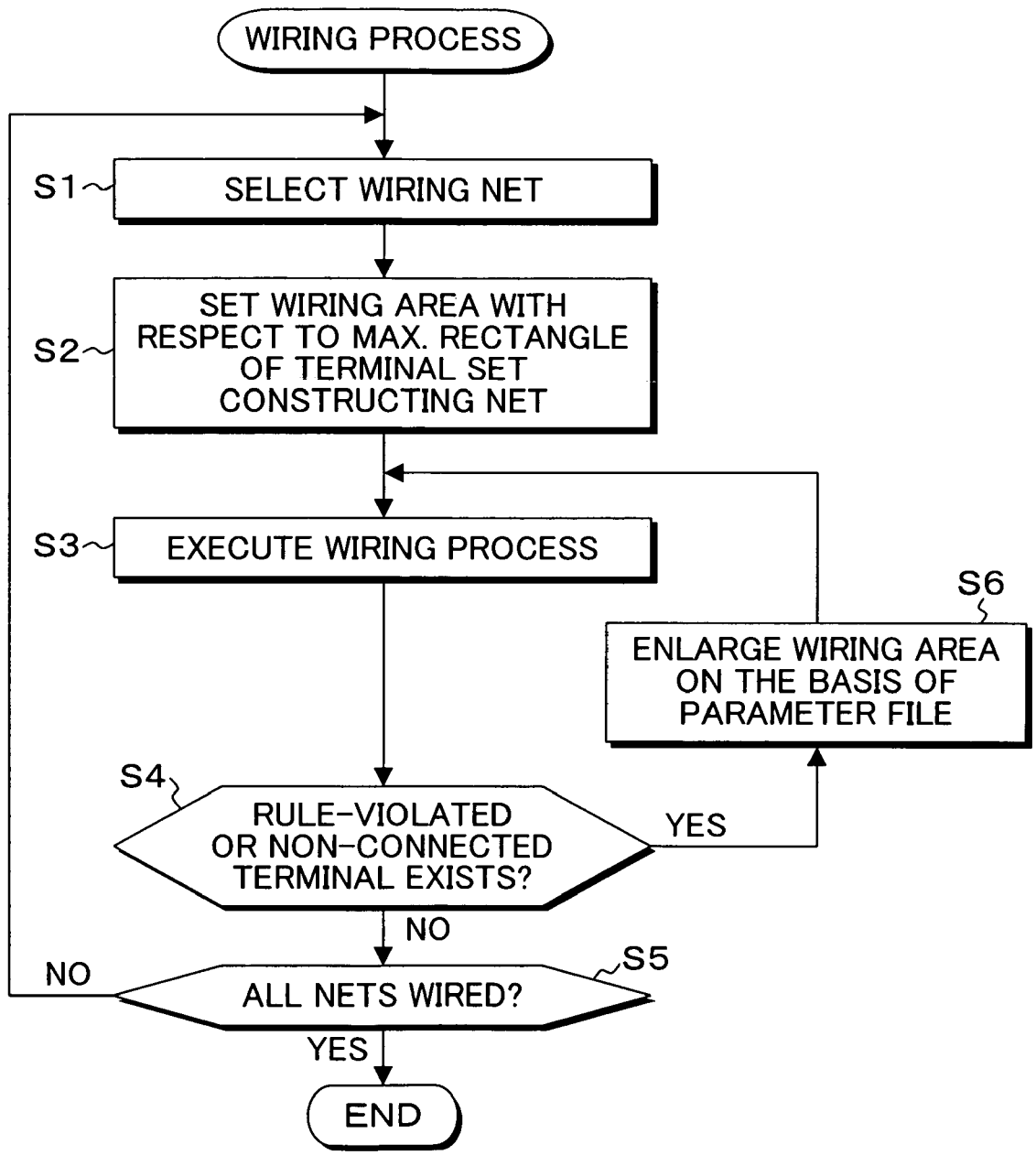
FIG. 11 is a flowchart for the wiring process according to the invention for the general net according to the invention as a target.

FIG. 11 is a flowchart for the wiring process according to the invention for the general net as a target. In FIG. 11, a wiring net is selected from the net list 32 in step S1. The wiring area is set with respect to the maximum rectangular shape including the set of the terminals constructing the net in step S2. The wiring process is executed to the set wiring area as a target in step S3. Subsequently, in step S4, a violation check about whether or not a spacing rule or a crossing rule is violated is made or the presence or absence of the non-connected terminal is discriminated. If there is a rule violation or a non-connected terminal, the processing routine advances to step S6. For example, the enlargement ratio (%) is obtained as a parameter from the parameter file 34 and the process to enlarge the present wiring area is executed. After that, the wiring process is executed to the enlarged wiring area as a target in step S3. The enlargement of the wiring area in step S6 is repetitively executed until the rule violation or the non-connected terminal is eliminated in step S4. Naturally, when an upper limit of the enlargement ratio is provided and the enlargement ratio reaches the upper limit, the process is finished as a wiring error. If the rule violation or non-connected terminal does not exist, the processing routine advances to step S5. Whether all nets have been wired or not is discriminated. If the process is not finished, the processes from step S1 are repeated. If it is confirmed that all of the nets have been wired, the processing routine is finished.

Figure 12A:
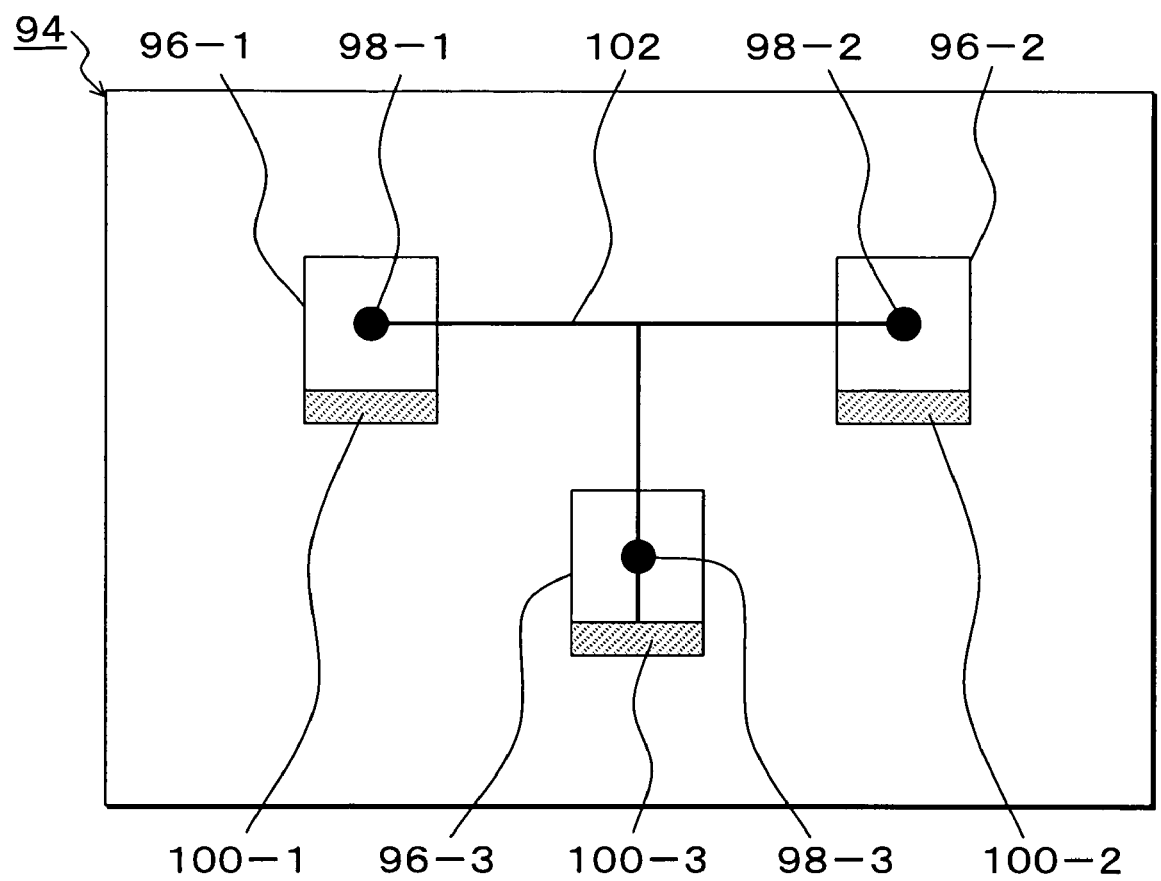
FIGS. 12A and 12B are explanatory diagrams of a conventional wiring process for a clip net and a wiring process for a clip net to which the invention is applied.
Figure 12B:
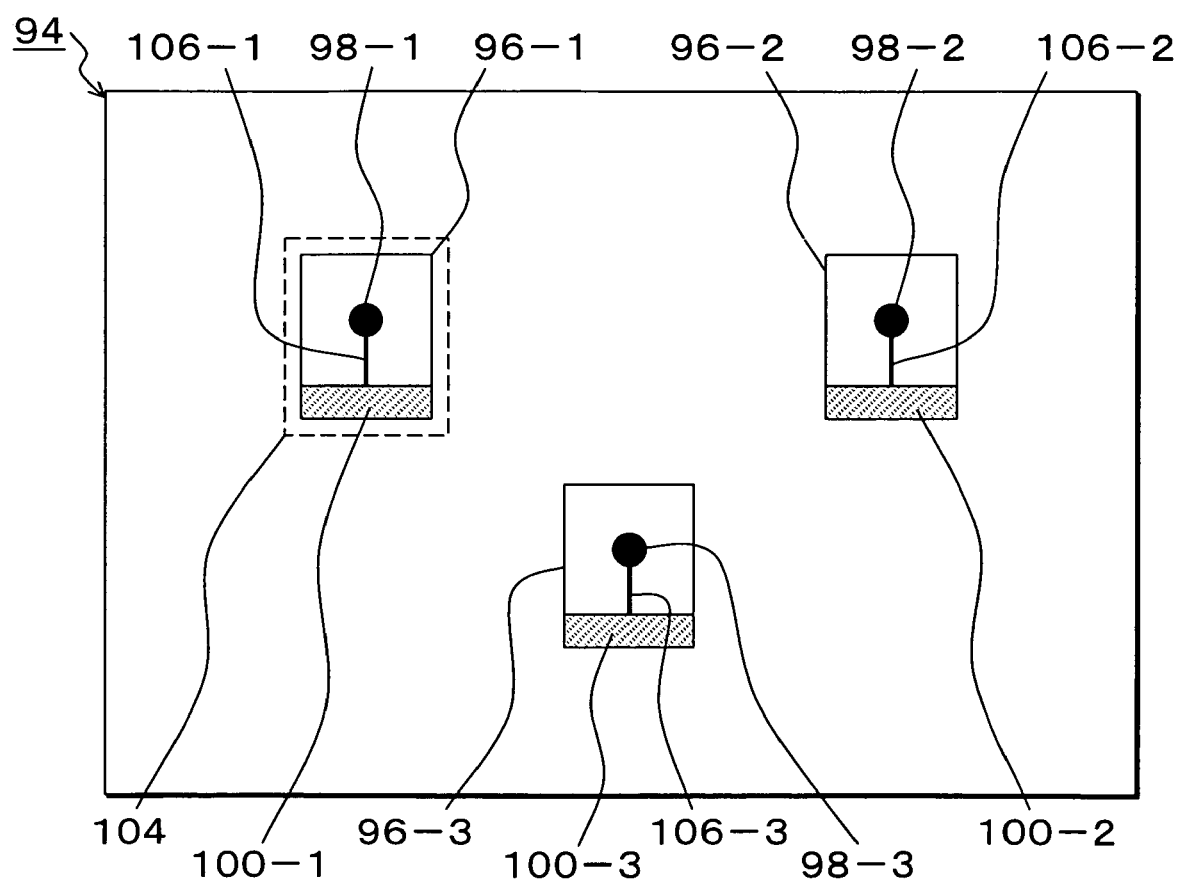

FIGS. 12A and 12B are explanatory diagrams of a conventional wiring process for the clip net and a wiring process for a clip net to which the invention is applied. FIG. 12A shows the conventional wiring process for the clip net. For example, three cells 96-1 to 96-3 are arranged on a chip 94. Clip terminals 98-1 to 98-3 and power terminals 100-1 to 100-3 are provided for the cells 96-1 to 96-3, respectively. To such clip terminals 98-1 to 98-3 as targets, the conventional wiring process for connecting them to the power terminals 100-1 to 100-3 is executed while using the whole chip 94 as a wiring area. Therefore, after the clip terminals 98-1 to 98-3 are mutually connected, a clip wiring 102 for connecting them to the power terminal 100-3 of the cell 96-3 is determined.

FIG. 12B shows the wiring process for the clip net according to the invention. In the invention, for example, as shown with respect to the cell 96-1, the cell area is set to a wiring area 104 and the wiring process is executed. Therefore, the clip terminal 98-1 of the cell 96-1 decides a clip wiring 106-1 connected to the power terminal 100-1 in the same cell. This is true of the other cells 96-2 and 96-3. Thus, in the clip wiring process of the invention, so long as the wiring inhibiting area does not exist in the cell, the clip net in which the clip terminal of the cell is connected to the power terminal of the same cell is constructed. Since the clip wiring 102 is wired to the outside of the cell, the wiring area for deciding another wiring path is not restricted. Since the wiring area is enclosed in the cell in principle, the burden of the wiring process is small and the processing time can be shortened.

Figure 13A:
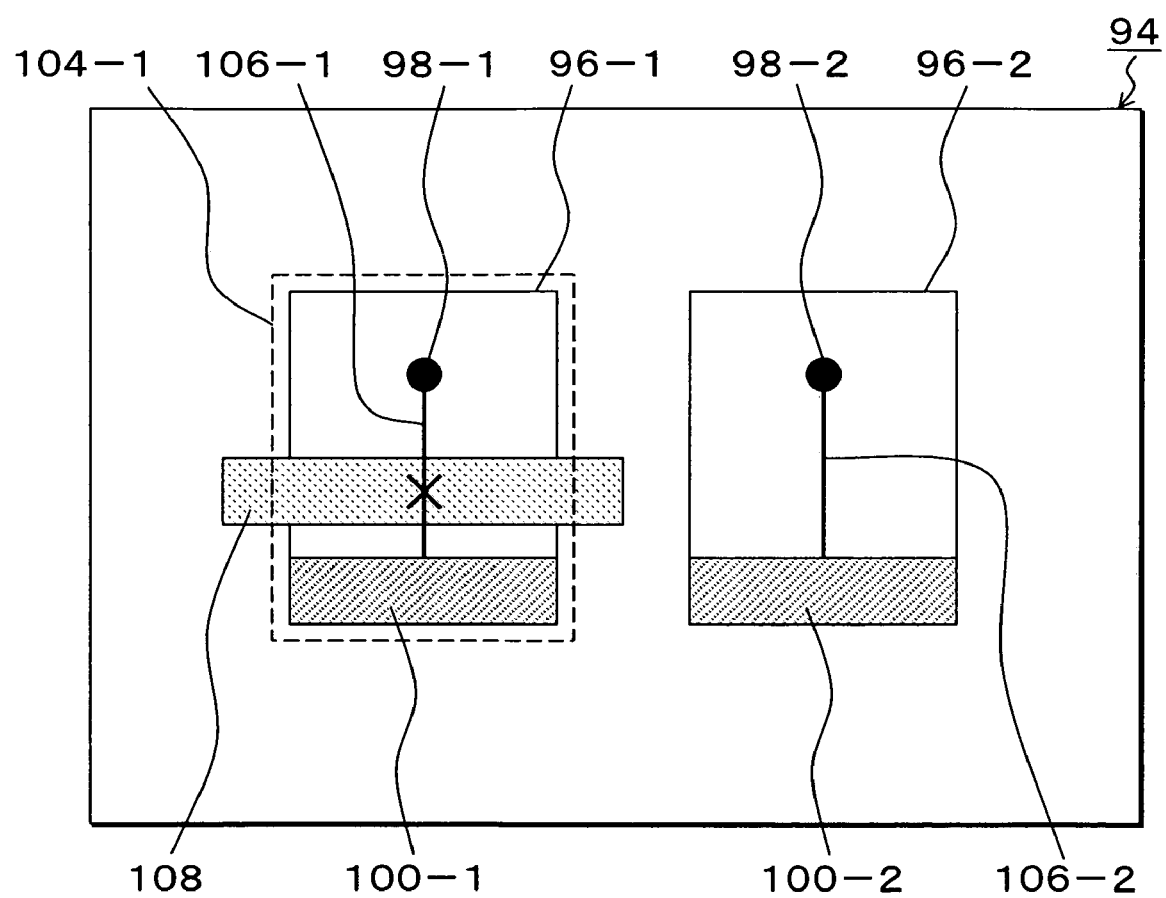
FIGS. 13A and 13B are explanatory diagrams of the wiring process for the clip net according to the invention in the case where a wiring inhibiting area exists.
Figure 13B:
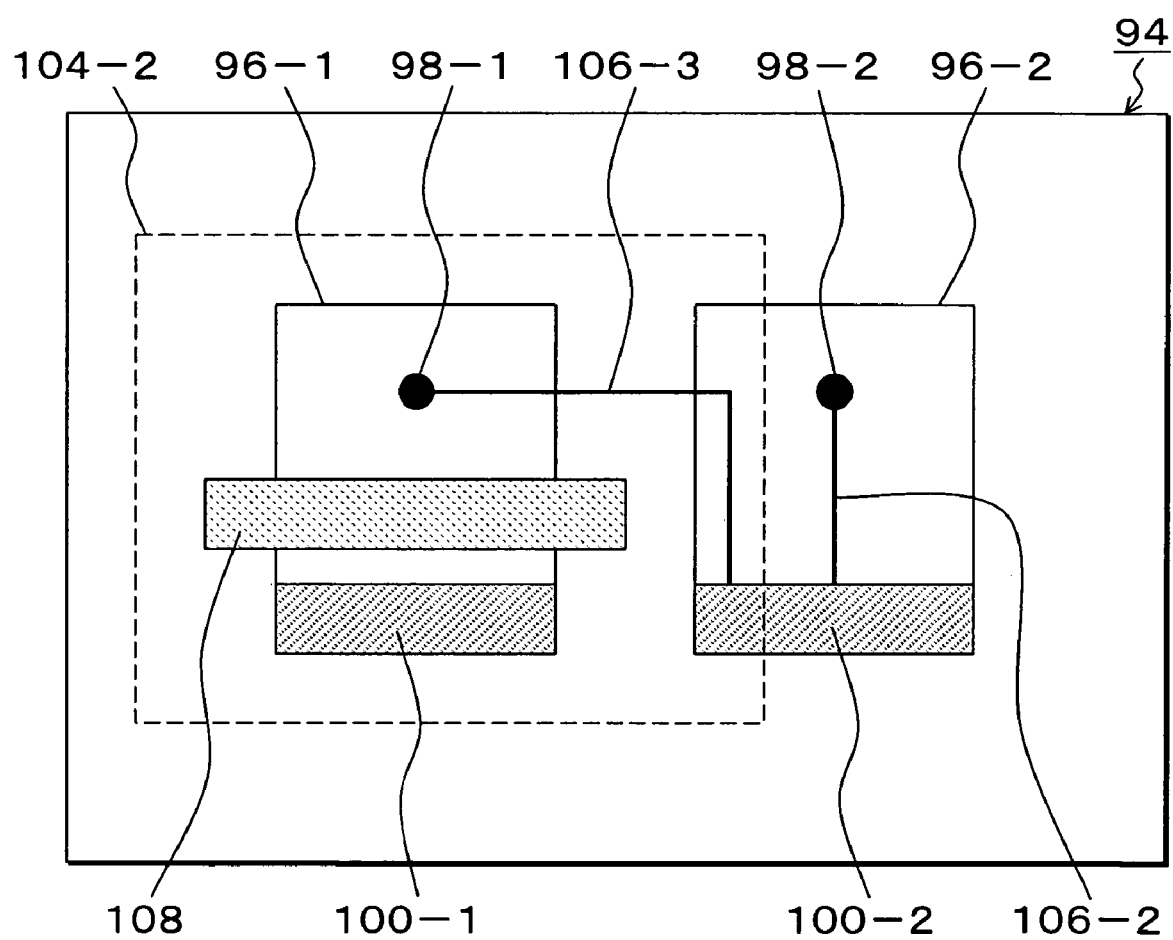

FIGS. 13A and 13B are explanatory diagrams of the wiring process for the clip net according to the invention in the case where a wiring inhibiting area exists. FIG. 13A shows the wiring process of the first time and a wiring inhibiting area 108 is set to the cell 96-1. In this case, with respect to cell 96-1, the wiring area of the first time is set like a wiring area 104-1 with regard to the cell area. Although the wiring area 104-1 is shown outside of the cell 96-1 for convenience of explanation, they are actually overlapped. When the wiring process by the setting of the wiring area 104-1 is executed, the clip wiring 106-1 connecting the power terminal 100-1 is wired from the clip terminal 98-1. However, since it passes through the wiring inhibiting area 108, the violation is detected by the violation check and the wiring is unsuccessful.

Therefore, as shown in FIG. 13B, the wiring area 104-1 is enlarged, a wiring area 104-2 is set, and the wiring process is executed to the wiring area 104-2 as a target. In this case, since a part of the power terminal 100-2 of the adjacent cell 96-2 is also included in the wiring area 104-2, a clip wiring 106-3 starting from the clip terminal 98-1 of the cell 96-1 and reaching the power terminal 100-2 of the adjacent cell 96-2 is decided.

FIG. 14 is a flowchart for the wiring process according to the invention for the clip net as a target. In FIG. 14, a clip terminal is searched from the net list 32 in step S1. The cell to which the clip terminal belongs is searched in step S2. Further, all clip terminals belonging to the searched cell are searched in step S3. Subsequently, the area of the cell frame is set to the wiring area in step S4. The clip wiring is executed in step S5. In next step S6, the clip wiring is checked. In step S7, whether or not a rule violation of the spacing rule or a crossing rule or the non-connected clip terminal exists is discriminated. If there is a clip terminal of the rule violation or non-connected terminal, the wiring of the rule violation or the non-connected clip terminal is deleted in step S8. After that, the wiring area is enlarged on the basis of the parameter in the parameter file 34 in step S9. After that, the processing routine is returned to step S5 and the clip wiring is executed. The processes in steps S5 to S9 are repeated until the rule violation or the non-connected terminal is eliminated in step S7. When the wiring is successful in step S7, whether or not all of the clip terminals have been wired is discriminated in step S10. If the non-wired clip terminal remains, the processing routine is returned to step S1 and processes similar to those mentioned above are repeated. If the end of the wiring of all of the clip terminals is determined in step S10, the processing routine is finished.

The invention is not limited to the foregoing embodiment but incorporates many proper modifications without losing the objects and advantages of the invention. Further, the invention is not limited by the numerical values shown in the foregoing embodiment.

What is claimed is:

1. A wiring method of deciding wiring on a net unit basis with respect to a semiconductor circuit, comprising:
   a wiring area setting step wherein a maximum rectangle including a set of terminals constructing a net is set into a wiring area;
   a wiring deciding step wherein wiring between the nets is decided so as to realize a shortest distance for said wiring area as a target; and
   a wiring area enlarging step wherein, if it is decided in said wiring deciding step that a non-connected terminal or a rule violation exists, the present wiring area is enlarged in accordance with a preset parameter and, thereafter, the wiring is decided in said wiring deciding step.

2. A wiring method for a clip net in which in the case where one of a plurality of input terminals having a same function of cells arranged in a semiconductor circuit is used, the non-used input terminals are wired as clip terminals to power terminals, comprising:
  a wiring area setting step wherein a cell area is set into a wiring area;
  a wiring deciding step wherein wiring between the clip terminal and the power terminal is decided so as to realize a shortest distance for said wiring area as a target; and
  a wiring area enlarging step wherein, if it is decided in said wiring deciding step that a non-connected clip terminal or a rule violation exists, the present wiring area is enlarged in accordance with a preset parameter and, thereafter, the wiring is decided in said wiring deciding step.

3. A method according to claim 1 or 2, wherein said parameter which is used in said wiring area enlarging step includes a default enlarging function for all nets as targets.

4. A method according to claim 1 or 2, wherein said parameter which is used in said wiring area enlarging step includes a different enlarging function in accordance with a type of net.

5. A method according to claim 4, wherein in said parameter which is used in said wiring area enlarging step, the enlarging function regarding a specific net is set to zero.

6. A method according to claim 1 or 2, wherein said parameter which is used in said wiring area enlarging step includes a different enlarging function in accordance with a wiring layer.

7. A method according to claim 1 or 2, wherein an enlarging function of said parameter which is used in said wiring area enlarging step is an enlargement ratio, the number of grids, or an increase dimension.

8. A method according to claim 1 or 2, wherein said parameter which is used in said wiring area enlarging step is an enlarging function of both or either of the horizontal direction and the vertical direction of the rectangular wiring area.

9. A computer-readable storage medium which stores a program for allowing a computer to execute:
  a wiring area setting step wherein a maximum rectangle including a set of terminals constructing a net is set into a wiring area;
  a wiring deciding step wherein wiring between the nets is decided so as to realize a shortest distance for said wiring area as a target; and
  a wiring area enlarging step wherein, if it is decided in said wiring deciding step that a non-connected terminal or a rule violation exists, the present wiring area is enlarged in accordance with a preset parameter and, thereafter, the wiring is decided in said wiring deciding step.

10. A computer-readable storage medium which stores a program for allowing a computer to execute:
  a wiring area setting step wherein a cell area having clip terminals serving as non-used input terminals in the case where one of a plurality of input terminals having a same function is used and power terminals is set into a wiring area;
  a wiring deciding step wherein wiring between the clip terminal and the power terminal is decided so as to realize a shortest distance for said wiring area as a target; and
  a wiring area enlarging step wherein, if it is decided in said wiring deciding step that a non-connected clip terminal or a rule violation exists, the present wiring area is enlarged in accordance with a preset parameter and, thereafter, the wiring is decided in said wiring deciding step.

11. A storage medium according to claim 9 or 10, wherein said parameter which is used in said wiring area enlarging step includes a default enlarging function for all nets as targets.

12. A program according to claim 9 or 10, wherein said parameter which is used in said wiring area enlarging step includes a different enlarging function in accordance with a type of net.

13. A storage medium according to claim 12, wherein in said parameter which is used in said wiring area enlarging step, the enlarging function regarding a specific net is set to zero.

14. A storage medium according to claim 9 or 10, wherein said parameter which is used in said wiring area enlarging step includes a different enlarging function in accordance with a wiring layer.

15. A storage medium according to claim 9 or 10, wherein an enlarging function of said parameter which is used in said wiring area enlarging step is an enlargement ratio, the number of grids, or an increase dimension.

16. A storage medium according to claim 9 or 10, wherein said parameter which is used in said wiring area enlarging step is an enlarging function of both or either of the horizontal direction and the vertical direction of the rectangular wiring area.

17. A wiring apparatus for deciding wiring on a net unit basis with respect to a semiconductor circuit, comprising:
  a wiring area setting unit which sets a maximum rectangle including a set of terminals constructing a net into a wiring area;
  a wiring deciding unit which decides the wiring between the nets so as to realize a shortest distance for said wiring area as a target; and
  a wiring area enlarging unit which, if it is decided in said wiring deciding unit that a non-connected terminal or a rule violation exists, enlarges the present wiring area in accordance with a preset parameter and, thereafter, allows said wiring deciding unit to decide the wiring.

18. A wiring apparatus for a clip net in which in the case where one of a plurality of input terminals having a same function of cells arranged in a semiconductor circuit is used, the non-used input terminals are wired as clip terminals to power terminals, comprising:
  a wiring area setting unit which sets a cell area into a wiring area;
  a wiring deciding unit which decides the wiring between the clip terminal and the power terminal so as to realize a shortest distance for said wiring area as a target; and
  a wiring area enlarging unit which, if it is decided in said wiring deciding step that a non-connected clip terminal or a rule violation exists, enlarges the present wiring area in accordance with a preset parameter and, thereafter, allows said wiring deciding unit to decide the wiring.

19. An apparatus according to claim 17 or 18, wherein said parameter which is used in said wiring area enlarging unit includes a default enlarging function for all nets as targets.

20. An apparatus according to claim 17 or 18, wherein said parameter which is used in said wiring area enlarging unit includes a different enlarging function in accordance with a type of net.

21. An apparatus according to claim 20, wherein in said parameter which is used in said wiring area enlarging unit, the enlarging function regarding a specific net is set to zero.

22. An apparatus according to claim 17 or 18, wherein said parameter which is used in said wiring area enlarging unit includes a different enlarging function in accordance with a wiring layer.

23. An apparatus according to claim 17 or 18, wherein an enlarging function of said parameter which is used in said wiring area enlarging unit is an enlargement ratio, the number of grids, or an increase dimension.

24. An apparatus according to claim 17 or 18, wherein said parameter which is used in said wiring area enlarging unit is an enlarging function of both or either of the horizontal direction and the vertical direction of the rectangular wiring area.

25. An automatic wiring method, comprising:
defining a wiring rectangle including a predetermined number of terminals, up to a total number of terminals;
routing a wiring network to connect the terminals within the wiring rectangle with the shortest distance; and
enlarging the wiring rectangle along two perpendicular sides according to a predetermined parameter when a terminal is not connected or the wiring network violates a user-defined rule.

* * * * *